(12) United States Patent
Okada et al.

(10) Patent No.: US 9,448,287 B2
(45) Date of Patent: Sep. 20, 2016

(54) BATTERY MONITORING DEVICE

(75) Inventors: Syuhei Okada, Musashino (JP); Satoshi Yoshitake, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 445 days.

(21) Appl. No.: 13/561,162

(22) Filed: Jul. 30, 2012

(65) Prior Publication Data
US 2013/0030596 A1 Jan. 31, 2013

(30) Foreign Application Priority Data

Jul. 29, 2011 (JP) .................................. 2011-166595
Oct. 13, 2011 (JP) .................................. 2011-225925

(51) Int. Cl.
| | |
|---|---|
| *G05D 11/00* | (2006.01) |
| *G05D 9/00* | (2006.01) |
| *H02J 7/00* | (2006.01) |
| *H02J 7/14* | (2006.01) |
| *G01N 27/416* | (2006.01) |
| *G01R 29/26* | (2006.01) |
| *H01M 2/00* | (2006.01) |
| *G01R 31/36* | (2006.01) |

(52) U.S. Cl.
CPC ....... *G01R 31/3651* (2013.01); *G01R 31/3662* (2013.01)

(58) Field of Classification Search
CPC .......... H02J 7/00; G06F 19/00; G06F 19/26; G01N 27/41; G01R 31/36
USPC ............ 702/63, 65; 320/119, 129, 136, 139; 324/427, 428, 430, 432, 434; 340/136, 340/636; 700/297
See application file for complete search history.

(56) References Cited

U.S. PATENT DOCUMENTS

| | | | | |
|---|---|---|---|---|
| 6,118,275 | A | * | 9/2000 | Yoon et al. ................... 324/427 |
| 7,675,293 | B2 | * | 3/2010 | Christophersen et al. ... 324/613 |
| 2001/0033169 | A1 | | 10/2001 | Singh et al. |
| 2002/0196025 | A1 | | 12/2002 | Freeman et al. |
| 2004/0076872 | A1 | * | 4/2004 | Kinoshita et al. .............. 429/61 |

(Continued)

FOREIGN PATENT DOCUMENTS

| | | |
|---|---|---|
| CN | 101131417 A | 2/2008 |
| CN | 102129041 A | 7/2011 |

(Continued)

OTHER PUBLICATIONS

Office Action dated Jul. 18, 2013 issued by the Japanese Patent Office in counterpart Japanese Application No. 2011225925.

(Continued)

*Primary Examiner* — Mohammad Ali
*Assistant Examiner* — Md Azad
(74) *Attorney, Agent, or Firm* — Sughrue Mion, PLLC

(57) ABSTRACT

A battery monitoring device for real-time measurement and monitoring of a battery module driving an actual load and having a plurality battery cells connected together in series, has a plurality of power and impedance calculators provided for the respective battery cells, and configured to receive voltage signals and current signals from the battery cells, respectively and to measure instantaneous power values and internal impedance characteristics of the battery cells, respectively, and a battery module state manager configured to receive output data of the power and impedance calculators via an internal bus.

8 Claims, 39 Drawing Sheets

(56) References Cited

U.S. PATENT DOCUMENTS

| | | |
|---|---|---|
| 2008/0048662 A1 | 2/2008 | Hirsch et al. |
| 2009/0096459 A1 | 4/2009 | Yoneda et al. |
| 2009/0174369 A1 | 7/2009 | Kawahara et al. |
| 2009/0295397 A1 | 12/2009 | Barsukov |
| 2011/0173585 A1 | 7/2011 | Hamano et al. |
| 2012/0310562 A1* | 12/2012 | van Lammeren et al. ..... 702/63 |
| 2013/0185008 A1 | 7/2013 | Itabashi et al. |
| 2013/0229156 A1* | 9/2013 | Brandon et al. ............ 320/136 |

FOREIGN PATENT DOCUMENTS

| | | |
|---|---|---|
| EP | 1088240 B1 | 4/2006 |
| JP | 2003-4780 A | 1/2003 |
| JP | 2004279153 A | 10/2004 |
| JP | 2007165211 A | 6/2007 |
| JP | 2010230469 A | 10/2010 |
| WO | 2012/035868 A1 | 3/2012 |

OTHER PUBLICATIONS

Hioki, Shinjiro et al., "Development of Lithium Ion Battery Controller", Calsonic Kansei Technical Review, Calsonic Kansei Corporation, vol. 7, 2010, pp. 6-10.

Search Report dated Nov. 13, 2015, issued by the European Patent Office in counterpart European Application No. 12178352.6.

* cited by examiner

|  | R1 | R2 | C2 | R3 | C3 |
|---|---|---|---|---|---|
| WITHOUT WEIGHTING (NORMAL) | 7.59% | -0.98% | 40.20% | -10.23% | 6.93% |
| WITH WEIGHTING (INVENTION) | 6.30% | 0.28% | 20.53% | -9.97% | 4.27% |

FIG. 18C

|  | R1 | R2 | C2 | R3 | C3 |
|---|---|---|---|---|---|
| WITH SPIKES | 41.56% | 54.47% | 2235.67% | -60.76% | -62.54% |
| WITH NO SPIKES | 14.84% | -6.92% | 121.11% | -10.25% | 26.68% |

|  | R1 | R2 | C2 | R3 | C3 |
|---|---|---|---|---|---|
| WITH SPIKES, UNCORRECTED | 41.56% | 54.47% | 2235.67% | -60.76% | -62.54% |
| WITH SPIKES, CORRECTED | 21.24% | -35.06% | 155.72% | -8.91% | 8.45% |

BATTERY MONITORING DEVICE

BACKGROUND

1. Technical Field

Embodiments described herein relates to a battery monitoring device. More specifically, the embodiments described herein relates to battery monitoring device which can measure and monitor the state of a battery in real time in the on-site such as a vehicle, a plant, or the like where the battery is used actually while controlling the actual load of the battery to a desired load state.

2. Related Art

Secondary batteries that are charged repetitively have been widely used as a driving power source for a drive motor of a hybrid vehicle, an electric vehicle, or the like. Furthermore, secondary batteries have been also widely used in industrial fields, public institutions, general households, or the like from the viewpoint that the secondary battery may store energy which is obtained from solar power generation, wind power generation, or the like with a relatively small environmental load, without depending on fossil fuel.

In general, these secondary batteries are configured as a battery module in which a predetermined number of battery cells from which a desired output voltage is obtained are connected in series, or as a battery pack in which a predetermined number of battery modules from which a desired output voltage is obtained are connected in parallel to obtain a desired current capacity (AH).

However, from a convenience aspect of a charging time, traveling distance, and the like, currently, it is believed that the lithium ion battery will become the mainstream for secondary batteries that are mounted in vehicles as a driving power source for a driving motor.

FIG. 32 shows a block diagram illustrating an example of a battery system using the secondary battery in the related art. In FIG. 32, a battery module 10 is configured in such a manner that a plurality of battery cells $11_1$ to $11_n$ and a current sensor 12 are connected in series, and the battery module 10 is connected to a load L in series.

A battery monitoring device 20 includes a plurality of A/D converters $21_1$ to $21_{n+1}$ that are provided to independently correspond to the plurality of battery cells $11_1$ to $11_n$ and the current sensor 12 that make up the battery module 10, and a processing device 23 to which output data of the A/D converters $21_1$ to $21_{n+1}$ is input via an internal bus 22.

An output voltage of each of the battery cells $11_1$ to $11_n$ of the battery module 10 and a detection signal of the current sensor 12 of the battery module 10 are input to the corresponding A/D converters $21_1$ to $21_{n+1}$ and are converted to digital signals, and the output data of the A/D converters $21_1$ to $21_{n+1}$ is input to the processing device 23 via the internal bus 22.

The processing device 23 obtains, for example, an internal resistance value of each of the battery cells $11_1$ to $11_{n+1}$ based on the output data of the A/D converters $21_1$ to $21_{n+1}$, estimates a value corresponding to voltage drop at the time of taking out a desired current from the internal resistance value, and transmits this data to a host battery system controller 40 via an external bus 30.

The battery system controller 40 controls the battery module 10 and the load device L in order to stably drive the load device L by a current output voltage of the battery module 10 based on the data input from the battery monitoring device 20.

As an index of evaluating performance of the secondary battery making up the battery module 10, an internal impedance characteristic shown in FIGS. 33 and 34 may be exemplified. FIG. 33 shows a diagram illustrating an impedance characteristic example in a case where a fully charged battery is left as is in a high-temperature state, and FIG. 34 shows a diagram illustrating an impedance characteristic example in the case of repeated charge and discharge in a high-temperature state. In addition, in FIGS. 33 and 34, the left-side drawing illustrates a Cole-Cole plot in which complex impedance based on an AC impedance measurement result is plotted in complex coordinates, and the right-side drawing illustrates a Bode diagram showing an impedance frequency characteristic.

The left-side drawing of FIG. 33 shows a process in which the period left increases, for example, for one year, for two years, . . . , AC impedance increases. The left-side drawing of FIG. 34 shows a process in which as the charge and discharge is repeated, for example, for 50 times, for 100 times, . . . , the AC impedance increases.

As the impedance increases, voltage drop of a battery increases when producing a current, and thus a sufficient output voltage may not be obtained. A low-frequency portion of the right-side drawing corresponds to a case in which an accelerator of a vehicle is continuously pressed for a long time. From this data, since the impedance increases at the low-frequency portion, it may be assumed that the voltage drop gradually increases. That is, an output characteristic varies according to deterioration of the battery, and thus a sufficient output may not be produced.

FIG. 35 shows a block diagram illustrating an example of a measuring circuit that measures the AC impedance of the secondary battery in the related art, and in FIG. 35, the same reference numerals are attached to the same parts as FIG. 32. In FIG. 35, a sweep signal generator 50 is connected to both ends of a serial circuit of the battery 10 and the current sensor 12. This sweep signal generator 50 outputs an AC signal in which an output frequency varies in a sweeping manner within a range including a frequency characteristic region shown in the right-side drawing of FIGS. 33 and 34 to the serial circuit of the battery 10 and the current sensor 12.

An AC voltage monitor 60 measures AC voltage of both ends of the battery 10, and inputs this AC voltage to an impedance calculator 80. An AC current monitor 70 measures an AC current that flows to the current sensor 12 and inputs this AC current to the impedance calculator 80.

The impedance calculator 80 calculates complex impedance of the battery 10, which is a ratio between a measured voltage of the AC voltage monitor 60 at each frequency of the output signal of the sweep signal generator 50 and a measured current of the AC current monitor 70. The calculated complex impedance is plotted on the complex plane, thereby obtaining the Cole-Cole plot shown in FIGS. 33 and 34.

From the Cole-Cole plot that is created in this way, for example, each parameter of an equivalent circuit of the battery 10 as shown in FIG. 36 may be estimated. In addition, in the equivalent circuit of FIG. 36, a DC power source B, a resistor R1, a parallel circuit of a resistor R2 and a capacitor C2, a parallel circuit of a resistor R3 and a capacitor C3, and a parallel circuit of a resistor R4 and an inductance L4 are connected in series. JP-A-2003-4780 discloses in detail measurement of impedance by an alternating current method together with an automatic measurement method.

On the other hand, a controller as disclosed in Non-patent document 1 has been developed (and put into practical use) to monitor the state of a lithium ion battery mounted in a vehicle and supply a higher-level system with information for maximum utilization of battery performance as well as to stop the system if an abnormality as renders the user in danger should occur.

PRIOR ART DOCUMENTS

Patent Documents

[Patent document 1] JP-A-2003-4780

Non-Patent Documents

[Non-patent document 1] Shinjiro Hold and other five persons, "Development of Lithium Ion Battery Controller," Calsonic Kansei Technical Review, Calsonic Kansei Corporation, Vol. 7, 2010, pp. 6-10.

As described above, since various kinds of information of a battery may be obtained through measurement of the internal impedance characteristic of the battery, when the internal impedance characteristic of the battery may be measured in the on-site such as a vehicle, a power plant, a household power storage system, and the like that actually use the battery, a present state of the battery may be ascertained based on the information, and the battery may be controlled so as to be effectively used to the maximum depending on the present state of the battery.

However, in the system configuration in the related art shown in FIG. 32, the internal resistance value of each of the battery cells $11_1$ to $11_n$ may be obtained, but since data communication between the processing device 23 and the battery system controller 40 is performed intermittently, voltage data of each of the battery cells $11_1$ to $11_n$ becomes discrete data of which a period is, for example, 100 ms or more.

As a result thereof, only a state of each of the battery cells $11_1$ to $11_n$ may be detected with reference to a table including a voltage, a current, a temperature, and the like that are instantaneous ones or ones obtained by integration averaging over a prescribed time, and the internal impedance characteristic of each of the battery cells $11_1$ to $11_n$ in which many pieces of information are collectively contained may not be measured.

In addition, according to the measuring circuit in the related art as shown in FIG. 35, the sweep signal generator 50 is necessary, and it is difficult to mount the measuring circuit as shown in FIG. 35 in each of the on-site cells in terms of both cost and space.

SUMMARY OF THE INVENTION

It is an illustrative aspect of the invention to provide a battery monitoring device which can measure an internal impedance characteristic of a battery and monitor its state in real time in the on-site such as a vehicle, a power plant, a household power storage system, or the like where the battery is used actually while controlling the actual load of the battery to a desired load state.

According to one or more illustrative aspects of the present invention, there is provided a battery monitoring device for real-time measurement and monitoring of a battery module driving an actual load and having a plurality battery cells connected together in series, comprising:

a plurality of power and impedance calculators provided for the respective battery cells, and configured to receive voltage signals and current signals from the battery cells, respectively and to measure instantaneous power values and internal impedance characteristics of the battery cells, respectively; and a battery module state manager configured to receive output data of the power and impedance calculators via an internal bus.

According to one or more illustrative aspects of the present invention, the battery monitoring device may further comprise an accelerator work monitor configured to monitor movement of an accelerator which is part of a vehicle driving system as a load device of the battery module, and to supply a resulting detection signal to the power and impedance calculators and the battery module state manager.

According to one or more illustrative aspects of the present invention, each of the power and impedance calculators may be configured to perform discrete Fourier transformation or fast Fourier transformation, and to estimate constants of an equivalent circuit that exhibits an internal impedance characteristic of the associated battery cell in a desired frequency domain on the basis of results of the discrete Fourier transformation or fast Fourier transformation.

According to one or more illustrative aspects of the present invention, each of the power and impedance calculators may be configured to acquire measurement data at such a time resolution and in such a time span that optimum estimation of a time constant of reaction occurring in a battery cell is enabled according to the reaction time constant, and to estimate constants of an equivalent circuit that are considered to govern the time constant using the acquired measurement data.

According to one or more illustrative aspects of the present invention, the power and impedance calculators may be configured to receive pieces of temperature information of the battery cells, respectively.

According to one or more illustrative aspects of the present invention, the battery monitoring device may further comprise a pseudo-load device connected to the actual load in parallel and configured to generate a waveform including high-frequency components.

According to one or more illustrative aspects of the present invention, the battery monitoring device may further comprise a load control unit configured to drive and control the actual load according to a load program.

According to the invention to provide a battery monitoring device which can measure an internal impedance characteristic of a battery and monitor its state in real time in the on-site such as a vehicle, a power plant, a household power storage system, or the like where the battery is used actually while controlling the actual load of the battery to a desired load state.

Other aspects and advantages of the present invention will be apparent from the following description, the drawings and the claims.

BRIEF DESCRIPTION OF THE DRAWINGS

FIG. 18A to 18C show drawings illustrating the comparison example of sample impedance obtained with and without detection of spikes;

DETAILED DESCRIPTION

Figure 1:
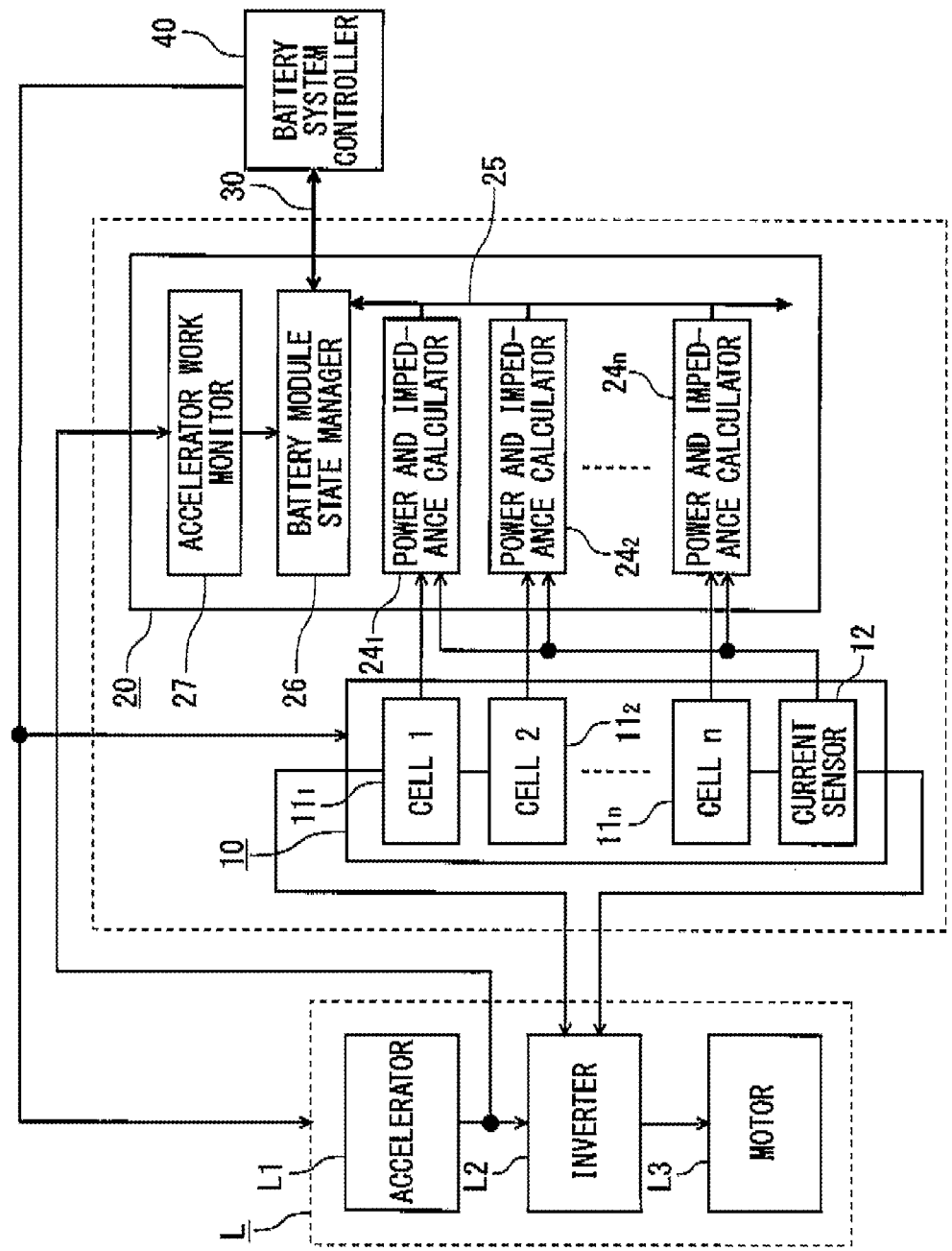
FIG. 1 shows a block diagram illustrating a specific example of a battery monitoring device according to an embodiment of the invention.
Figure 32:
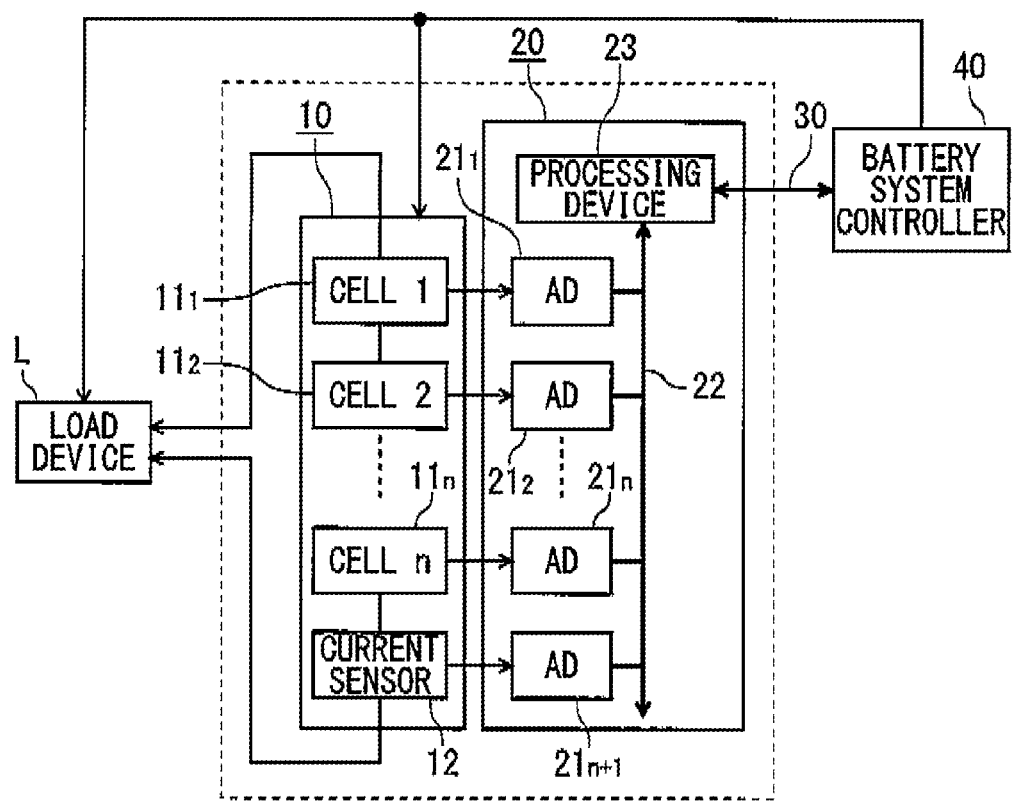
FIG. 32 shows a block diagram illustrating an example of a battery system using a secondary battery in the related art.
Figure 33:
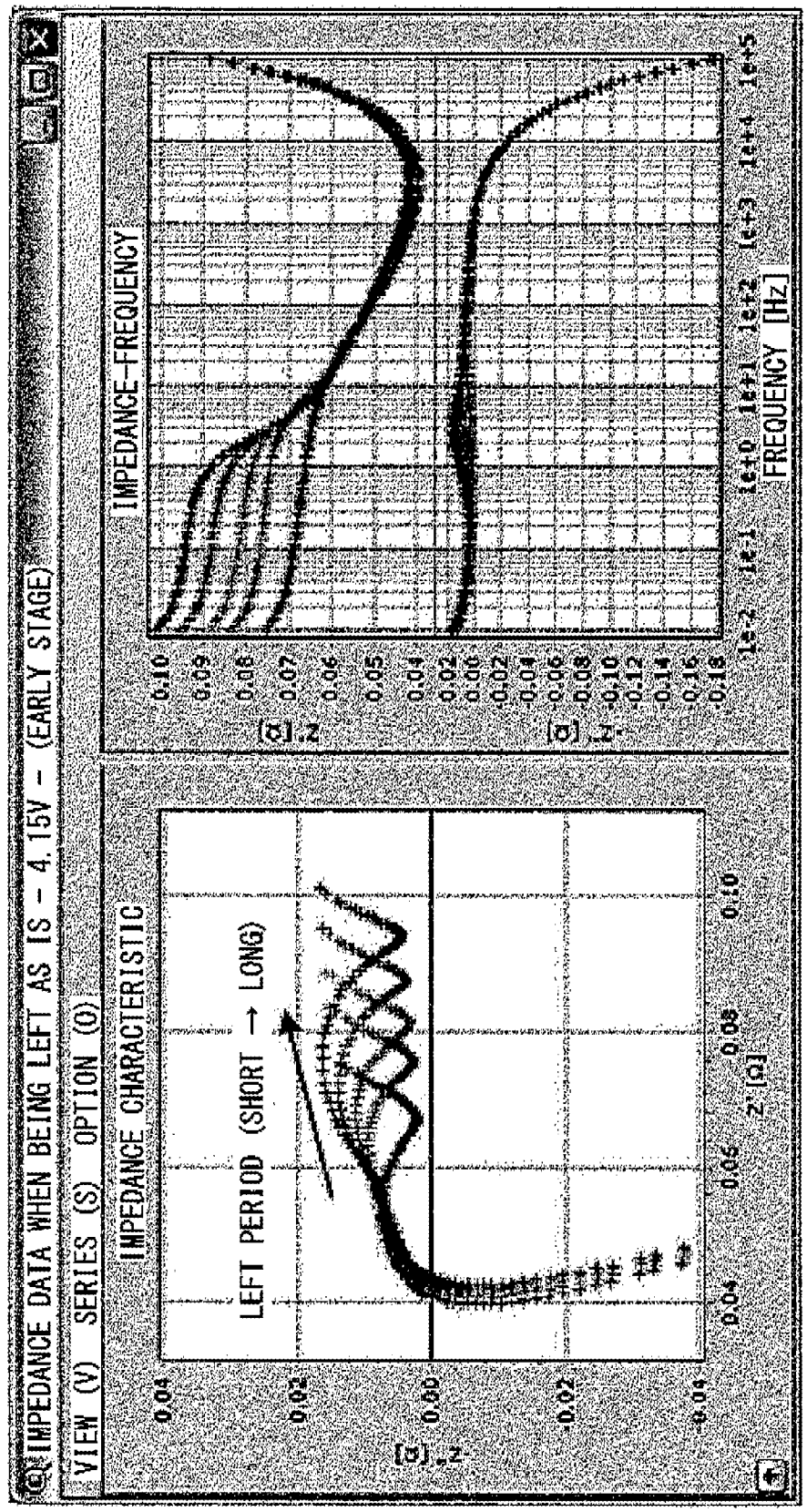
FIG. 33 shows a diagram illustrating an impedance characteristic example in a case where a fully charged battery is left in a high-temperature state.
Figure 34:
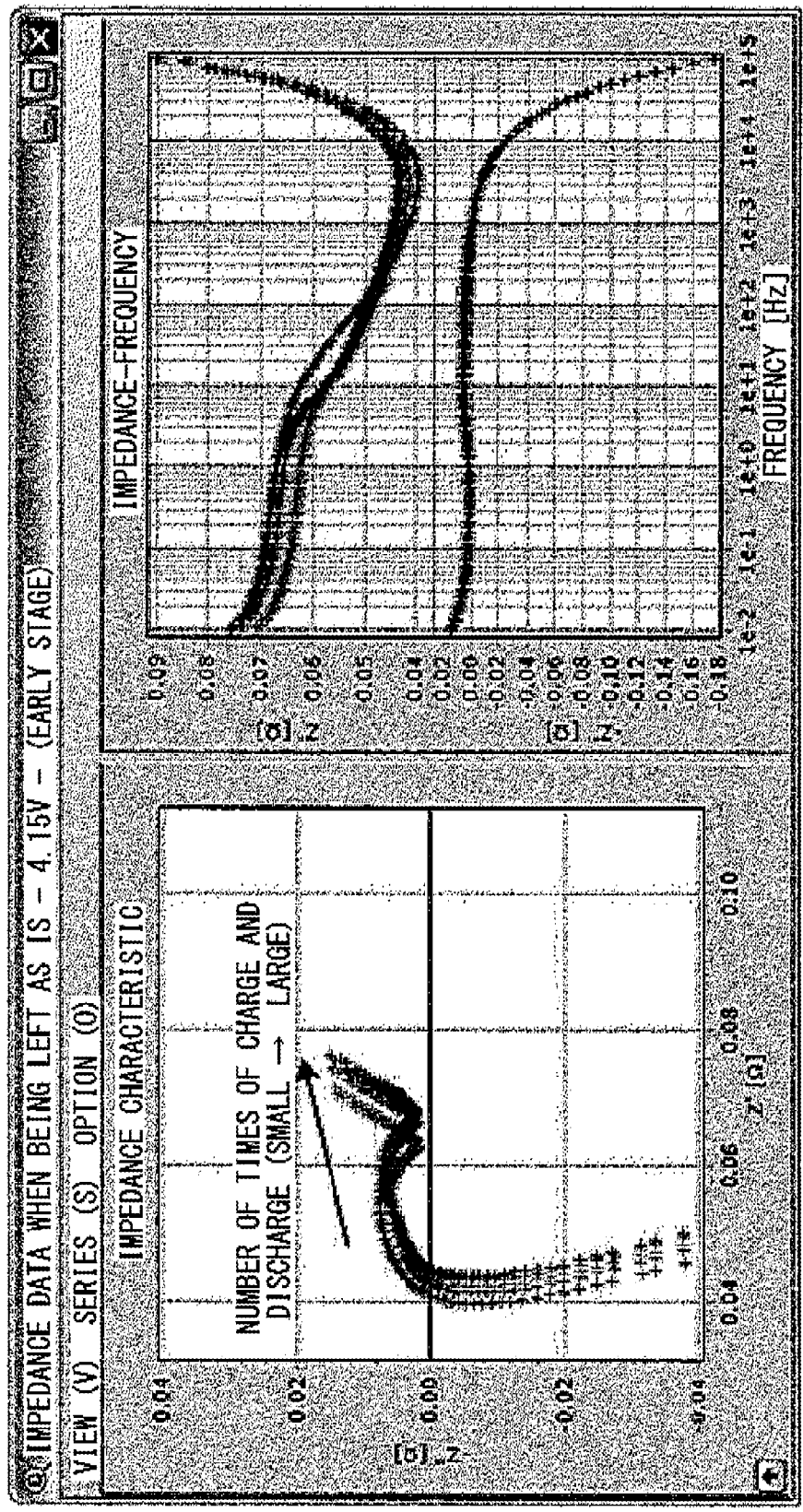
FIG. 34 shows a diagram illustrating an impedance characteristic example in the case of repeated charge and discharge in a high-temperature state.
Figure 35:
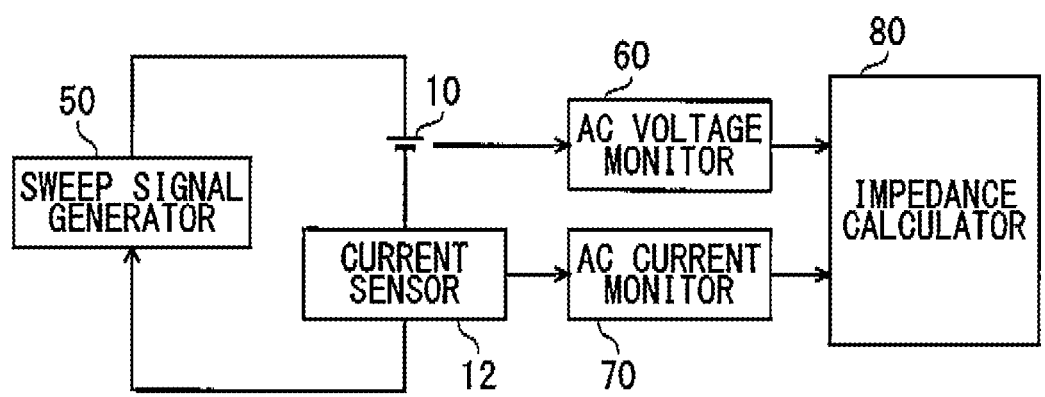
FIG. 35 shows a block diagram illustrating an example of a measuring circuit that measures the AC impedance of the secondary battery in the related art.

Hereinafter, embodiments of the invention will be described in detail with reference to the attached drawing. FIG. 1 is a block diagram illustrating an embodiment of the invention, and the same reference numerals are attached to the same portions as FIG. 32. In FIG. 1, a battery monitoring device 20 includes a plurality of n power and impedance calculators $24_1$ to $24_n$ that are provided in correspondence with a plurality of battery cells $11_1$ to $11_n$ that make up a battery module 10, a battery module state manager 26 to which output data of the power and impedance calculators $24_1$ to $24_n$ is input via an internal bus 25, and an accelerator work monitor 27 that monitors movement of an accelerator L1 makes up a driving system of a vehicle as a load device L.

In the driving system of a vehicle as the load device L, the accelerator L1, an inverter L2, and a motor L3 are substantially connected in series. The inverter L2 and the battery module 10 are connected in series, and driving power necessary for rotary driving of the motor L3 is supplied from the battery module 10. A speed of the motor L3 is controlled to rotate at a driver's intended rotational speed by controlling an amount of driving power that is supplied to the inverter L2 in response to movement of the accelerator L1 that is manipulated by the driver, for example, by using a pedal.

The movement of the accelerator L1 in response to the pedal manipulation by the driver is continuously monitored and detected by the accelerator work monitor 27, and a detection signal thereof is input to the power and impedance calculators $24_1$ to $24_n$ via the battery module state manager 26 and the internal bus 25.

A voltage signal from each of the corresponding battery cells $11_1$ to $11_n$ and a current signal from the current sensor 12 are input to the power and impedance calculators $24_1$ to $24_n$.

Here, the movement of the accelerator L1 in response to the pedal manipulation by the driver causes a variation such as rising and falling like a staircase wave including broadband frequency components with respect to an output voltage waveform of each of the battery cells $11_1$ to $11_n$ and an output current waveform of the current sensor 12.

In the embodiment of the invention, the power and impedance calculators $24_1$ to $24_n$ perform discrete Fourier transformation (DFT) or fast Fourier transformation (FFT) with respect to waveform data including the broadband frequency components, and estimate an equivalent circuit constant in a desired frequency domain from this result. The internal impedance characteristic of the battery may be measured in the on-site such as a vehicle and a plant that actually use the battery, and the battery state may be monitored in real time.

The battery module state manager 26 fetches instantaneous power information and internal impedance information, which are measured by each of the power and impedance calculators $24_1$ to $24_n$, of the respective battery cells $11_1$ to $11_n$ that make up the battery module 10, and transmits the data to a host battery system controller 40 via the external bus 30.

The battery system controller 40 controls the battery module 10 and the load device L based on data that is input from the battery monitoring device 20 so as to stably operate the load device L with a current output voltage of the battery module 10, ascertains a transitional situation in the performance of each of the battery cells $11_1$ to $11_n$ based on a variation trend of an amount of instantaneous power of each of the battery cells $11_1$ to $11_n$, a variation trend of the internal impedance information, or the like, dispatches an alarm that urges the charging to be performed, or outputs replacement time prediction data about the battery module 10, or the like by analyzing performance deterioration trend.

Figure 2:
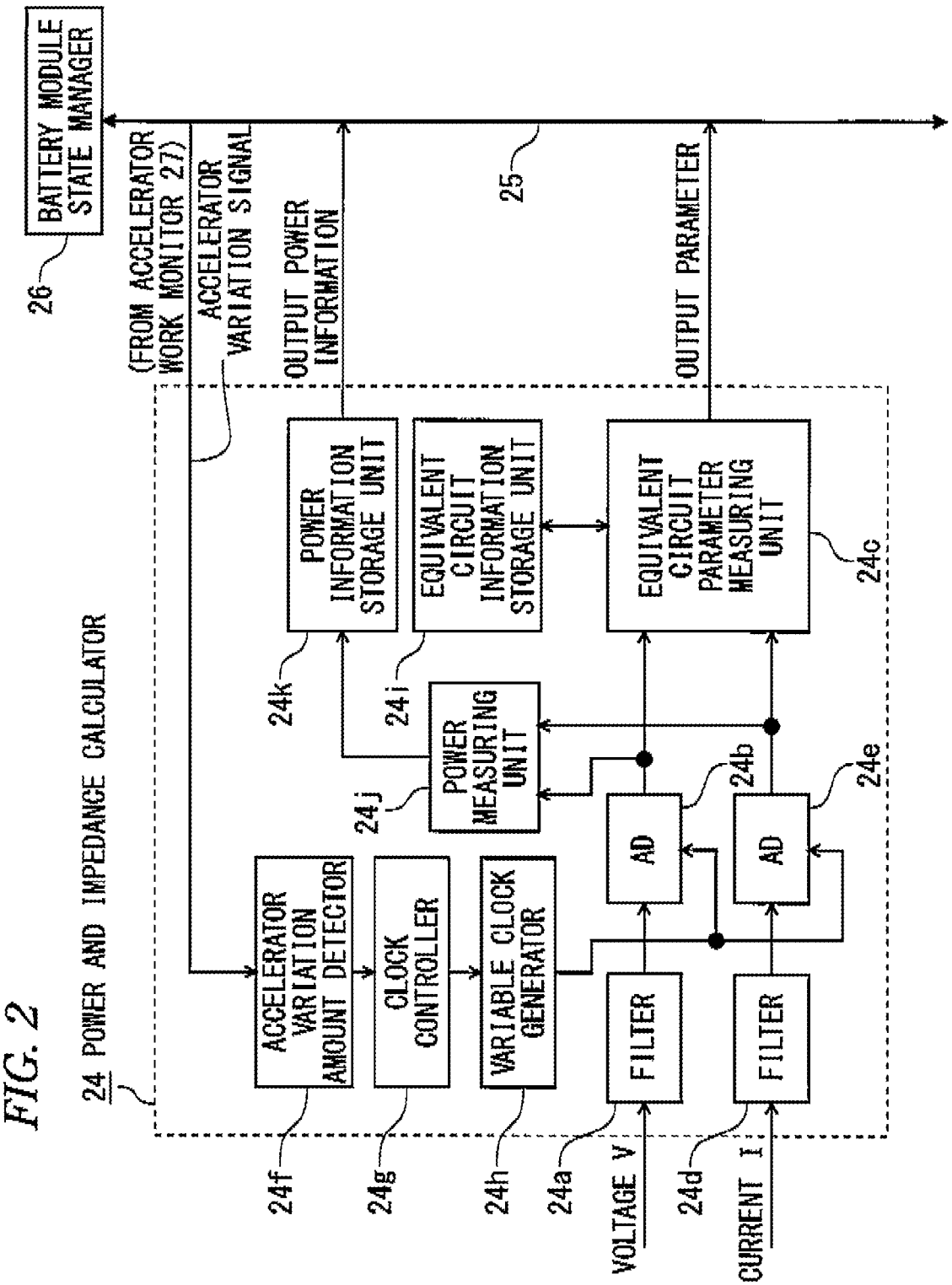
FIG. 2 shows a block diagram illustrating a specific example of a power and impedance calculator 24.

FIG. 2 shows a block diagram illustrating a specific example of the power and impedance calculator 24. In FIG. 2, a voltage signal V of each of the battery cells $11_1$ to $11_n$ is input to an A/D converter 24b via an anti-aliasing filter 24a, and output data of the A/D converter 24b is input to an equivalent circuit parameter measuring unit 24c.

A current signal I from the current sensor 12 is input to an A/D converter 24e via an anti-aliasing filter 24d, and output data of the A/D converter 24e is input to the equivalent circuit parameter measuring unit 24c.

The A/D converters 24b and 24e are operated by a variable clock system that is made up by the battery module state manager 26, an accelerator variation amount detector 24f, a clock controller 24g, and a variable clock generator 24h, and that is created based on an accelerator variation signal that is detected by the accelerator work monitor 27 and is output therefrom. Due to this, there is generated a clock based on driver's accelerator work such as start-up, acceleration, high-speed travel, low-speed travel, deceleration, stop, retraction, and a speed thereof, and the voltage signal V and the current signal I in each state are converted to digital data.

In addition, a sampling clock frequency of the A/D converters 24b and 24e may be changed in response to a frequency band at which the internal impedance of each of the battery cells $11_1$ to $11_n$ is desired to be measured. For example, in the case of measuring the internal impedance up to 1 kHz, the sampling clock frequency is set to 2K sample/s, and a low-pass band of the anti-aliasing filters 24a and 24d is set to 1 kHz or less.

An equivalent circuit information storage unit 24i, which stores equivalent circuit information such as an equivalent circuit pattern of each of the battery cells $11_1$ to $11_n$ that are desired to be measured, is connected to the equivalent circuit parameter measuring unit 24c. Each parameter of the equivalent circuit, which is measured in the equivalent circuit parameter measuring unit 24e, is fetched to the battery module state manager 26 via the internal bus 25.

Output data of the A/D converters 24b and 24e is also input to a power measuring unit 24j. Due to this, the power measuring unit 24j measures instantaneous power of each of the battery cells $11_1$ to $11_n$, and stores the measured result in a power information storage unit 24k. The power information stored in the power information storage unit 24k is fetched to battery module state manager 26 via the internal bus 25.

Figure 3:
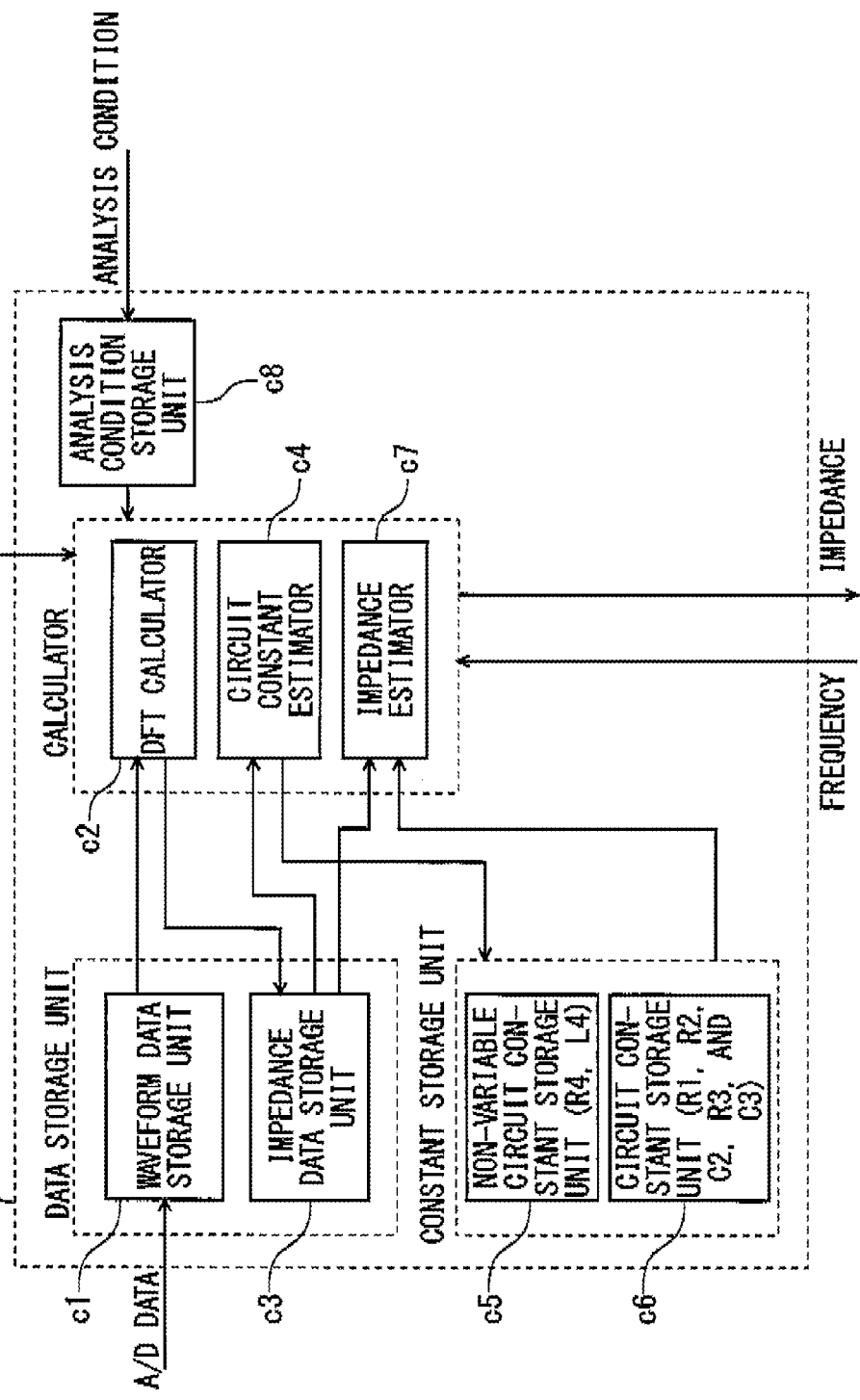
FIG. 3 shows a block diagram illustrating a specific example of an equivalent circuit parameter measuring unit 24c of FIG. 2.

FIG. 3 shows a block diagram illustrating an embodiment of the invention, which has an impedance estimation function in an arbitrary frequency, and shows a specific example of the equivalent circuit parameter measuring unit 24c making up the power and impedance calculator 24 of FIG. 2. Output data of the A/D converters 24b and 24e is sequentially stored in a waveform data storage unit c1.

A DFT calculator c2 performs discrete Fourier transformation with respect to waveform data of the voltage signal and the current signal that are sequentially stored in the waveform data storage unit c1, calculates impedance by dividing a discrete Fourier transformation result of the voltage signal by a discrete Fourier transformation result of the current signal, and stores the calculated impedance data in an impedance data storage unit c3. In addition, depending on a type of the waveform data, high-speed of a calculation process may be realized by using a FFT calculator in place of the DFT calculator c2.

A circuit constant estimator c4 performs constant fitting in an equivalent circuit model, which is designated in advance, based on the impedance data that is stored in the impedance data storage unit c3. In regard to a circuit constant, which is estimated and calculated by the circuit constant estimator c4, for example, in the case of an equivalent circuit shown in FIG. 3, R4 and L4 are stored in a non-variable circuit constant storage unit c5, and R1, R2, C2, R3, and C3 are stored in a circuit constant storage unit c6.

An impedance estimator c7 outputs impedance at an arbitrary frequency. With respect to a frequency domain at which impedance data is present, impedance data that is stored in the impedance data storage unit c3 is output as is. With respect to a frequency domain at which impedance data is not present, impedance is estimated and calculated based on a circuit constant that is stored in the non-variable circuit constant storage unit c5 and the circuit constant storage unit c6, and the calculation result is output.

An analysis condition from the outside is stored in an analysis condition storage unit c8. The analysis condition mainly represents a calculation condition in each calculator, but also includes information about reference measurement or measurement at the time of being mounted in a system.

In recent years, research on ascertaining a battery state has been actively performed. In this research, an impedance characteristic is obtained by applying a sign wave with a constant voltage or a constant current with respect to the battery, and a temperature characteristic of charge and discharge, a remaining amount of charge, a degree of performance deterioration, or the like is estimated.

In a single body state before a battery is mounted in a system such as a vehicle, impedance measurement may be performed in a prepared measurement environment, but when the battery is mounted in a system, the impedance measurement may not be performed sufficiently due to restriction on the system or the like, Particularly, when the battery is mounted as a driving power source of the vehicle, a sample rate on the system side is insufficient, and thus it is assumed that a high frequency domain may not be sampled. In this case, comparison in correspondence with a measurement range that is measured in advance may be impossible.

Figure 4A:
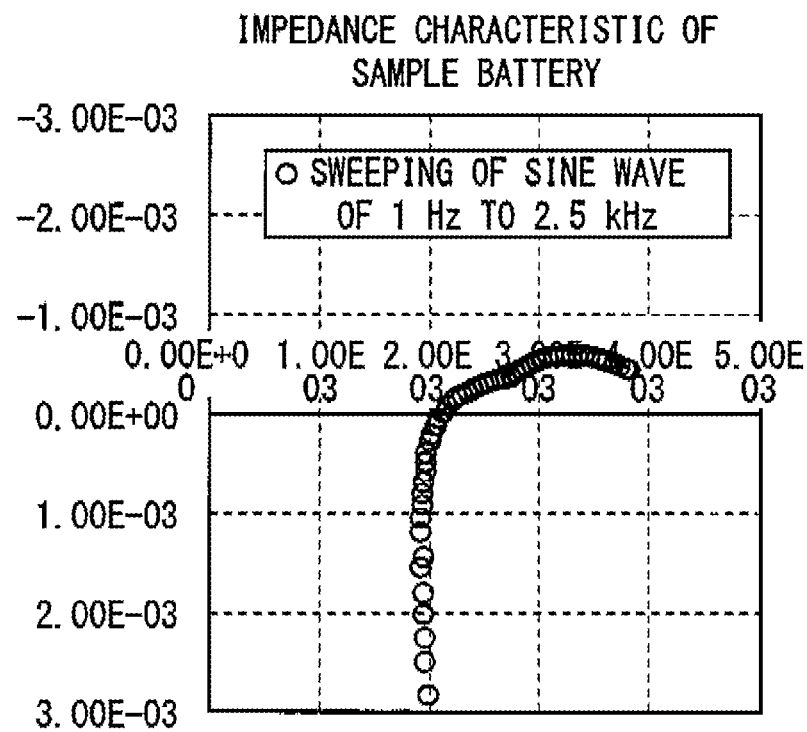
FIGS. 4A to 4D show diagrams of an impedance characteristic example of a battery.

FIGS. 4A to 4D shows a drawing of an impedance characteristic example of the battery, in which FIG. 4A shows a result that is measured while sweeping a sine wave in a frequency range of 1 Hz to 2.5 kHz and securing a sufficient sample rate at each measurement frequency point. Then, FIG. 4A is set as a reference characteristic.

Figure 4B:
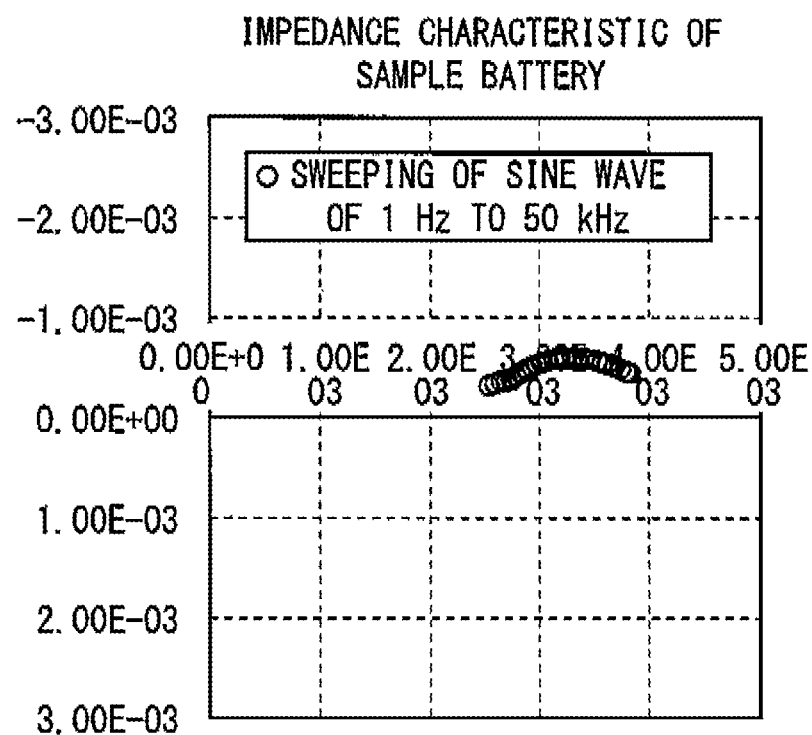

FIG. 4B shows a result that is obtained by taking out a frequency range of 1 to 50 Hz from the reference characteristic of FIG. 4A. This assumes a case in which a high frequency domain may not be measured due to restriction when the battery is mounted, for example, in a vehicle system. A positive side (a lower half portion of a graph) of an imaginary axis that is shown in. FIG. 4A is a region including L (inductance) information of the battery, but in FIG. 4B, this portion is completely omitted.

The inductance of the battery is a structural characteristic, and is considered not to vary with the passage of time due to deterioration of an electrode or an electrolytic solution. Based on this consideration, an equivalent circuit constant is obtained in advance from the reference characteristic of FIG. 4A, and this constant may be used with respect to a constant that does not vary with the passage of time even after the battery is mounted in a system.

Figure 4C:
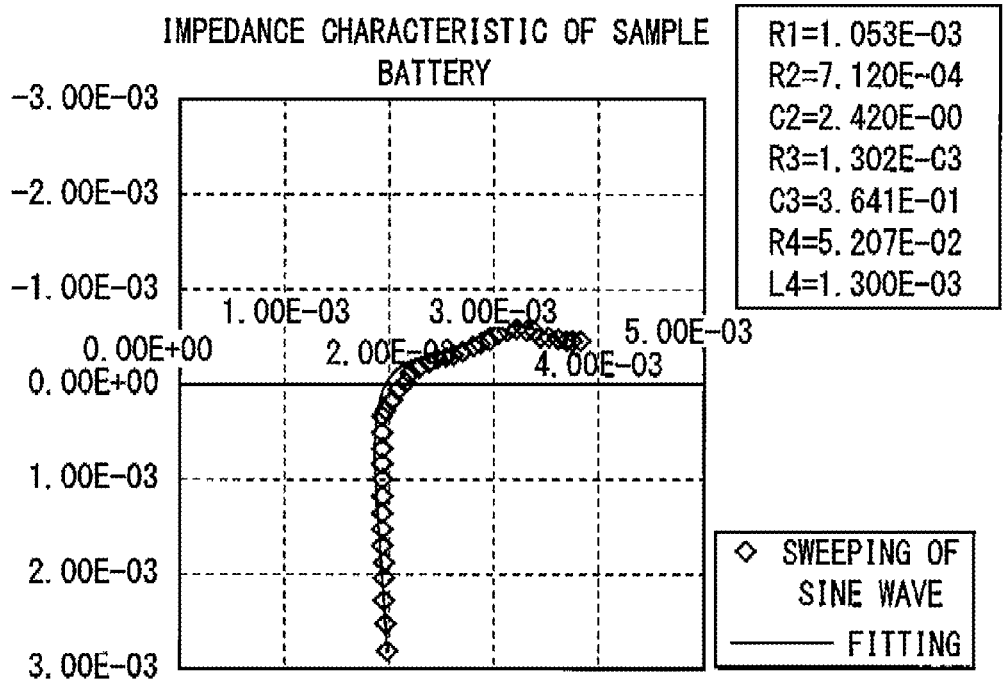
Figure 14:
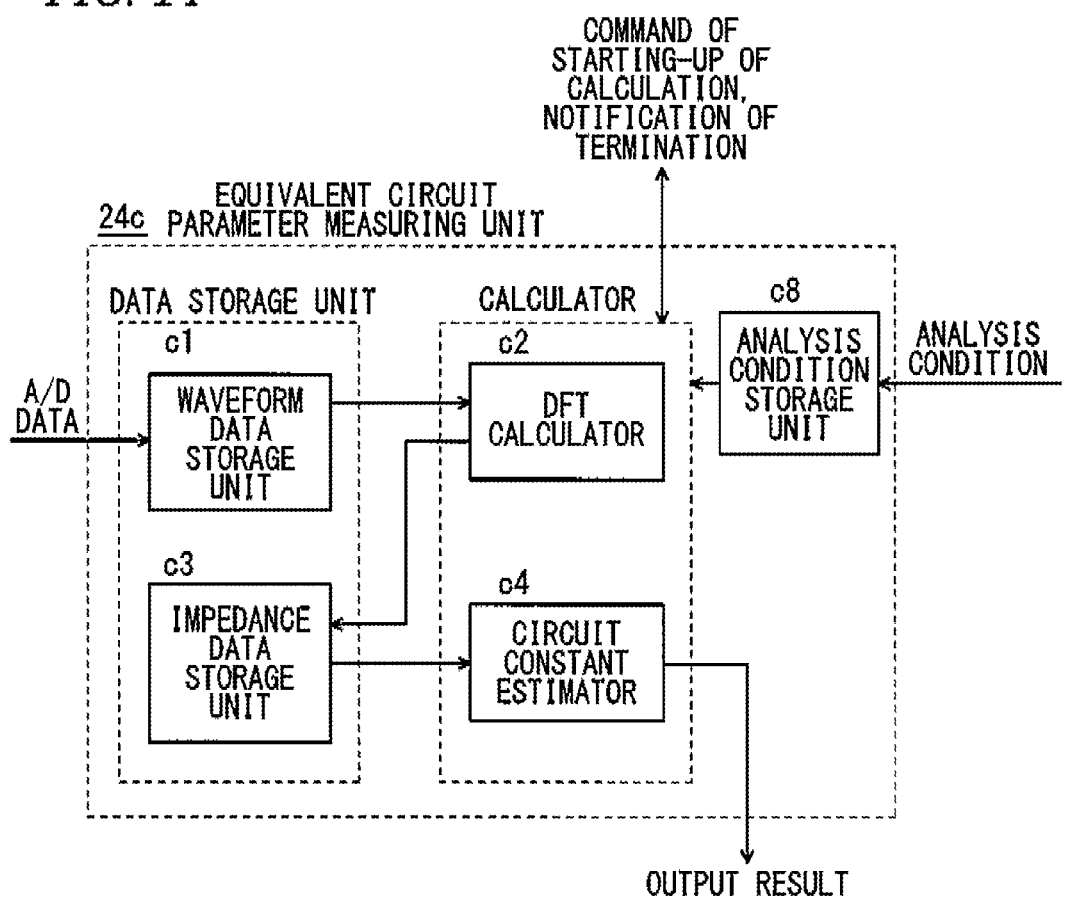
FIG. 14 shows a block diagram illustrating another example of an equivalent circuit parameter measuring unit 24c of FIG. 2.

FIG. 4C shows an impedance characteristic curve that is derived from R1, R2, R3, C2, C3, L4, and R4, and that is obtained by performing the constant fitting of the reference characteristic of FIG. 4A based on the equivalent circuit model of FIG. 14. The fitting may be performed based on a known arithmetic expression.

Figure 4D:
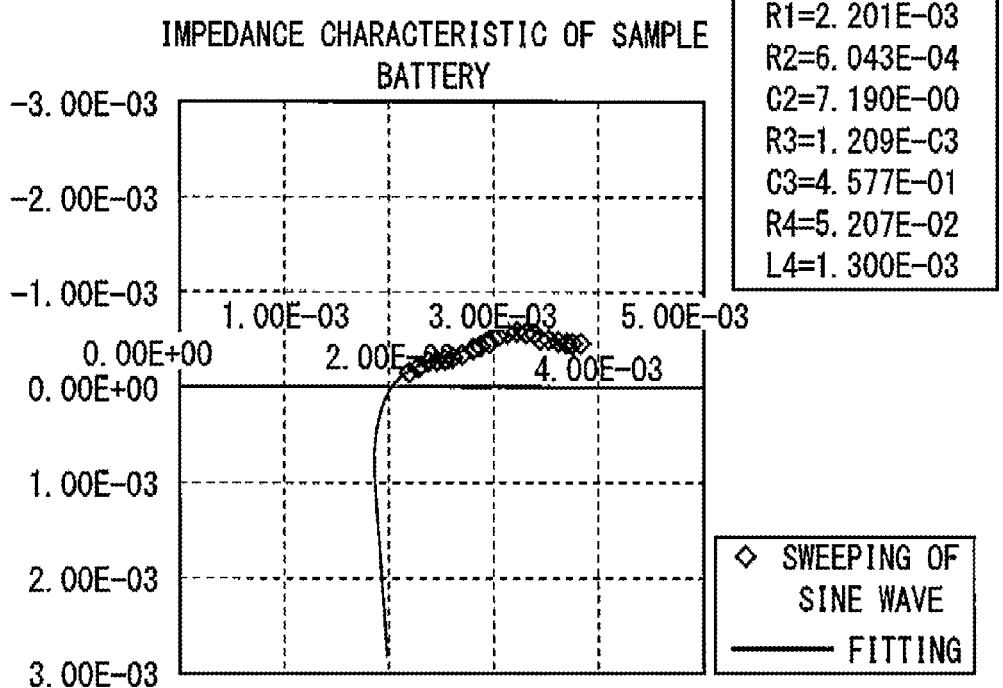

FIG. 4D shows an impedance characteristic curve that is derived from a result obtained by performing the constant fitting based on the equivalent circuit model of FIG. 14 by using circuit constants R1, R2, R3, C2, and C3 that are estimated in FIG. 4B, and L4 and R4 that are acquired in advance. The impedance characteristic curve of FIG. 4D is approximately equal to the impedance characteristic curve of FIG. 4C. That is, the impedance characteristic in a frequency domain corresponding to the reference characteristic of FIG. 4A may be estimated by using the estimated circuit constants R1, R2, R3, C2, and C3 that are estimated in FIG. 4B, and L4 and R4 that are acquired in advance.

In addition, in the embodiment of FIG. 3, the impedance estimation is performed by applying the non-variable circuit constant to the equivalent circuit model. However, instead of applying the non-variable circuit constant to the equivalent circuit, time-series data may be created from the non-variable circuit constant, this may be supplemented to time-series data that is measured, and then another circuit constant may be estimated.

In addition, in the embodiment in FIG. 3, the constant estimation is performed on the assumption that the L component does not have an effect on the low frequency domain. Therefore, the non-variable circuit constants L4 and R4 are not included in the equivalent circuit model during the constant estimation, and the non-variable circuit constants L4 and R4 are used only during the impedance estimation. However, there is a probability in that the L component may have an effect on the low frequency domain in accordance with a battery characteristic. In this case, the constant estimation may be performed after the non-variable circuit constants L4 and R4 are included in the equivalent circuit during the constant estimation.

Figure 5A:
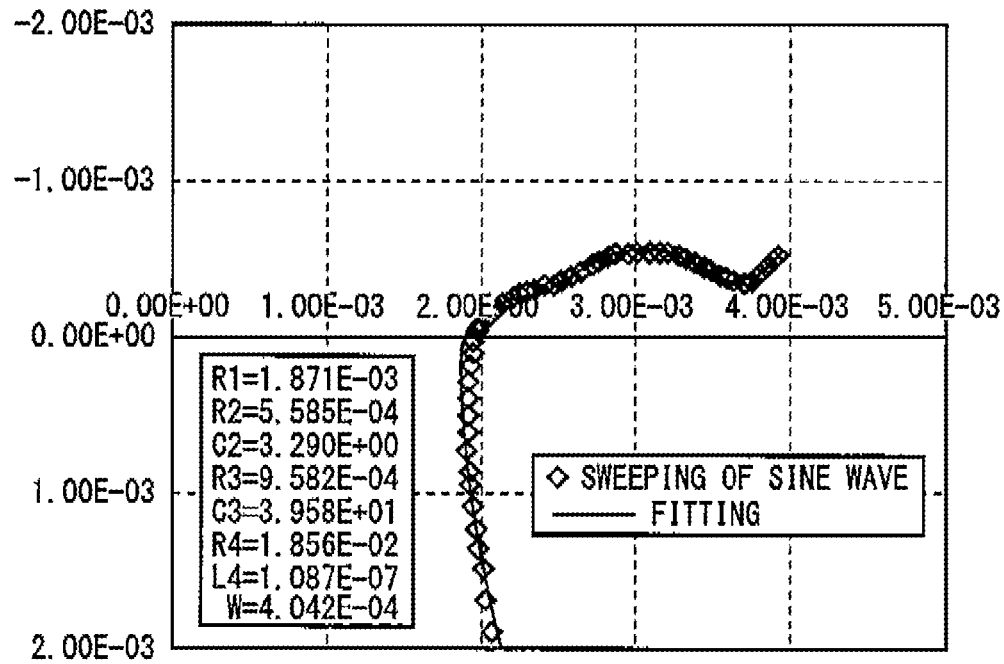
FIGS. 5A and 5B show diagrams of a constant-estimation impedance characteristic example with respect to an equivalent circuit of FIG. 36.
Figure 5B:
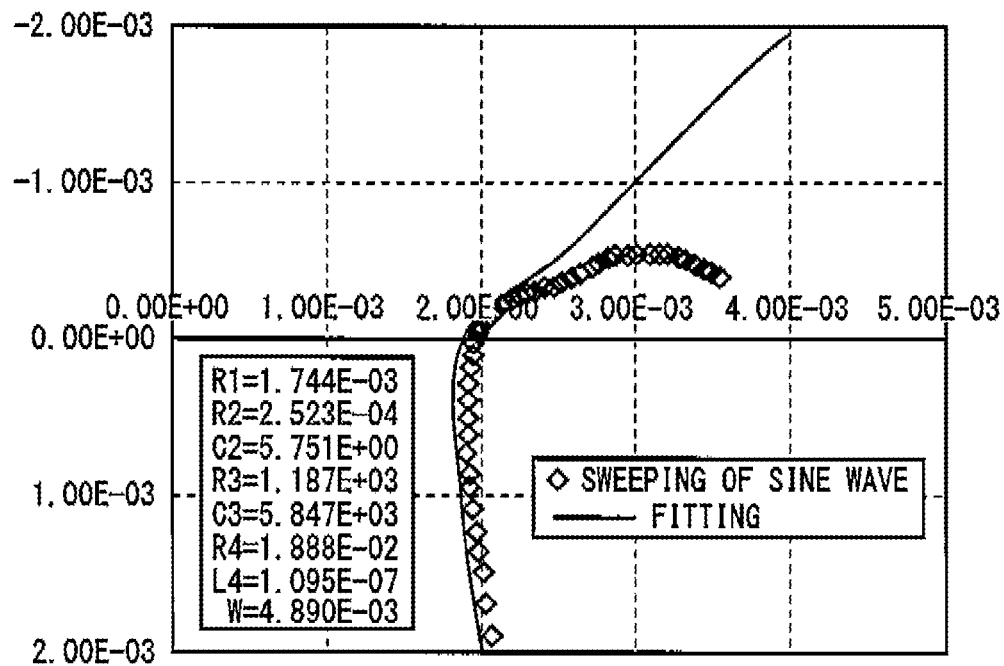

However, at the time of selecting the equivalent circuit model of the battery, in a case where an appropriate equivalent circuit model is selected after a characteristic inherent to a battery that is an object to be measured or a measurement frequency range is not recognized in advance, as shown in diagrams of an impedance characteristic example of FIGS. 5A and 5B, a constant estimation result that is different from an actual value may be obtained.

FIGS. 5A and 5B show results obtained by extracting data of different frequency ranges from the same impedance data, respectively, and by performing constant estimation in the equivalent circuit of FIG. 14. FIG. 5A is a result that is obtained by extracting 0.1 Hz or more, in which an impedance characteristic curve derived by constant fitting and an actual impedance characteristic are consistent with each other.

Conversely, FIG. 5B is a result that is obtained by extracting 1.0 Hz or more, in which an actual impedance characteristic is greatly deviated from an impedance characteristic curve derived by constant fitting. This is assumed to be because even though an actual product is provided with a Warburg element, a characteristic thereof is not significantly reflected on data and thus may be locally deficient. In this way, even in the same equivalent circuit model, when impedance frequency ranges that are used in the constant estimation are different from each other, results that are completely different from each other may be obtained.

Figure 6:
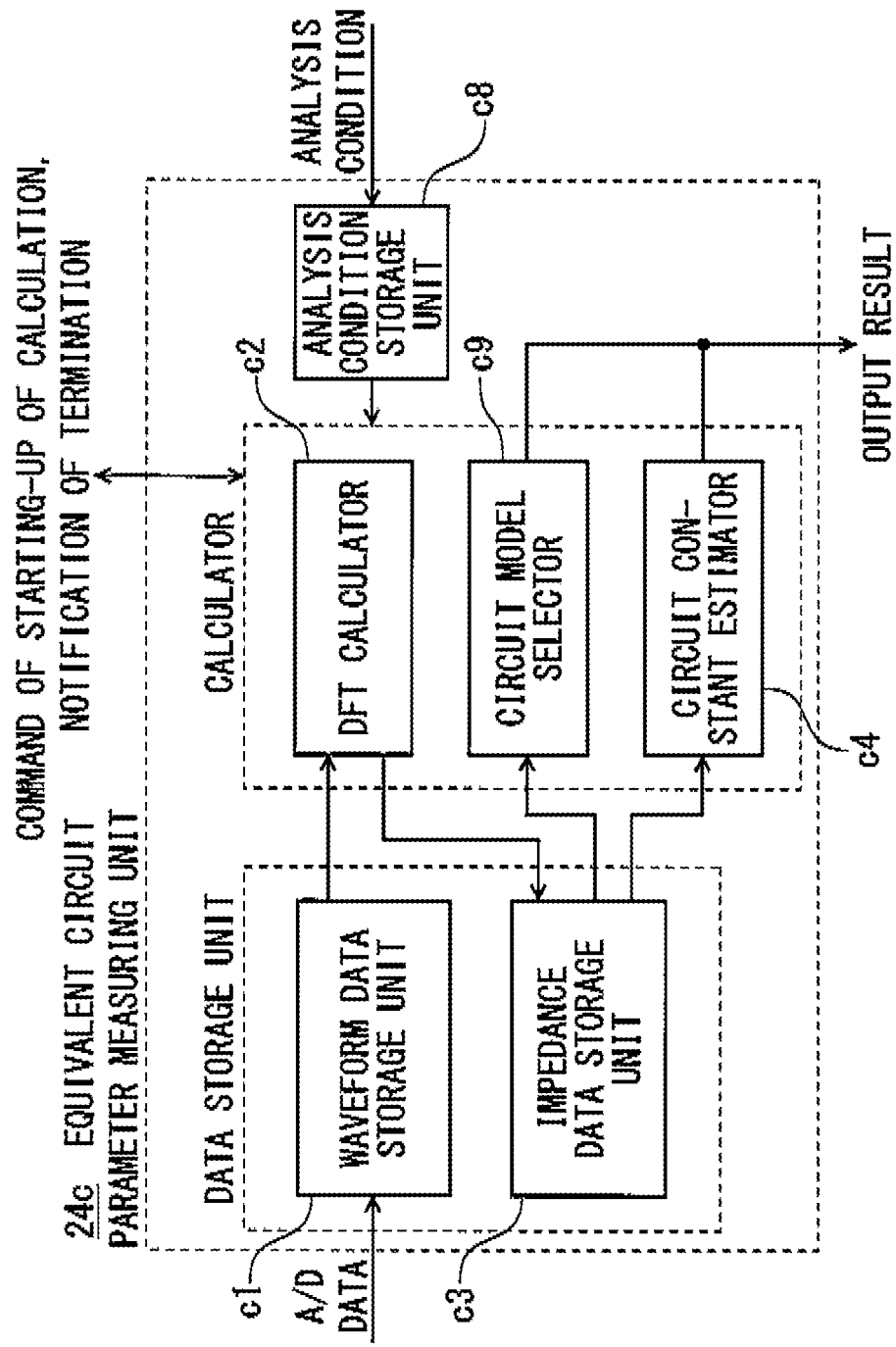
FIG. 6 shows a block diagram illustrating another example of an equivalent circuit parameter measuring unit 24c of FIG. 2.

This problem may be avoided by selecting an optimal equivalent circuit model based on a characteristic of impedance data by using a unit that is configured as shown in FIG. 6 as the equivalent circuit parameter measuring unit 24c, and accuracy of the circuit constant estimation may be improved.

FIG. 6 shows a block diagram illustrating another embodiment of the equivalent circuit parameter measuring unit 24c, and the same reference numerals are attached to the same portions as FIG. 3. In FIG. 6, a circuit model selector c9 selects an optimal equivalent circuit model based on impedance data characteristic that is estimated in the DFT calculator c2 and is stored in the impedance data storage unit c3. The circuit constant estimator c4 performs estimation and calculation of each circuit constant based on impedance data that is stored in the impedance data storage unit c3 and the optimal equivalent circuit model that is selected in the circuit model selector c9.

A battery equivalent circuit model that is generally used includes an RC parallel circuit of n stages, an LR parallel circuit of one stage, and a Warburg element. Therefore, the circuit model selector c9 sequentially determines a specific configuration of the equivalent circuit model in the following order.

1) Whether or not the Warburg element is present
2) Whether or not the LR parallel circuit is present
3) The number of stages of the RC parallel circuit 1) First, in regard to the Warburg element, whether or not the Warburg element is present is determined by using a correlation coefficient of impedance real axis and imaginary axis on a low frequency side. For example, in the case of Corr <0.99, it is determined that Warburg is present. The correlation coefficient is calculated by the following expression.

$$\text{Corr}(i) = \frac{\sum_{j=i-a}^{i+a}(Zreal_j - \overline{Zreal}_{i-a}^{i+a})(Zimg_j - \overline{Zimg}_{i-a}^{i+a})}{\sqrt{\sum_{j=i-a}^{i+a}(Zreal_j - \overline{Zreal}_{i-a}^{i+a})^2}\sqrt{\sum_{j=i-a}^{N}(Zimg_j - \overline{Zimg}_{i-a}^{i+a})^2}} \quad (1)$$

Here, Corr (i) represents a correlation coefficient at the periphery of $i^{th}$ impedance data, $Zreal_j$ and $Zimg_j$ represent a real part and an imaginary part of $j^{th}$ impedance data, respectively.

$$\overline{Zreal}_{i-a}^{i+a} \quad (2)$$

$$\overline{Zimg}_{i-a}^{i+a} \quad (3)$$

The above expressions (2) and (3) represent average values of the real part and the imaginary part of $i-a^{th}$ to $i+a^{th}$ impedance data, respectively. In addition, it is assumed that the impedance data is arranged in ascending order of a frequency.

Figure 7:
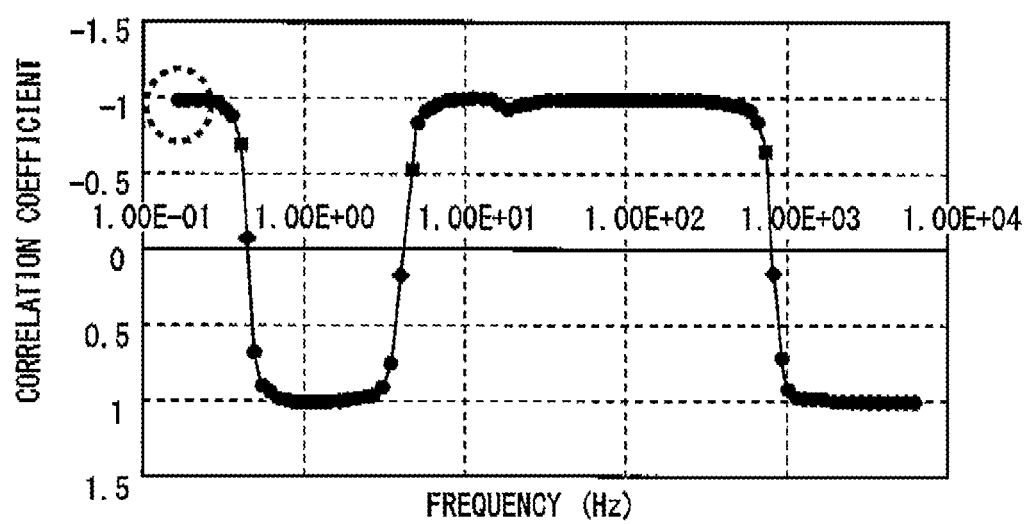
FIG. 7 shows a graph of a correlation coefficient Corr(i) where a is 4.

FIG. 7 shows a graph of the correlation coefficient Corr(i) in which a is four. In this current sample data, it is determined that Warburg is "present".

Figure 8:
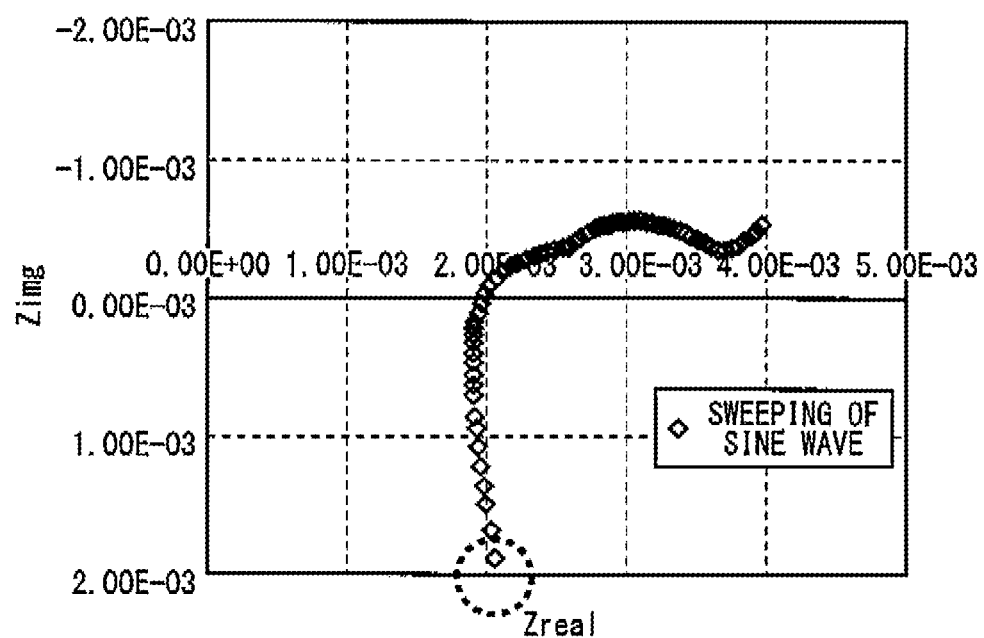
FIG. 8 shows a diagram of a sample impedance characteristic example.

2) Next, whether or not the LR parallel circuit is present is determined. When the impedance imaginary axis on a high frequency side shows a positive value, it is determined that the LR parallel circuit is necessary. In the case of a sample impedance characteristic diagram of FIG. 8, it is determined that the LR parallel circuit is "present".

Figure 9A:
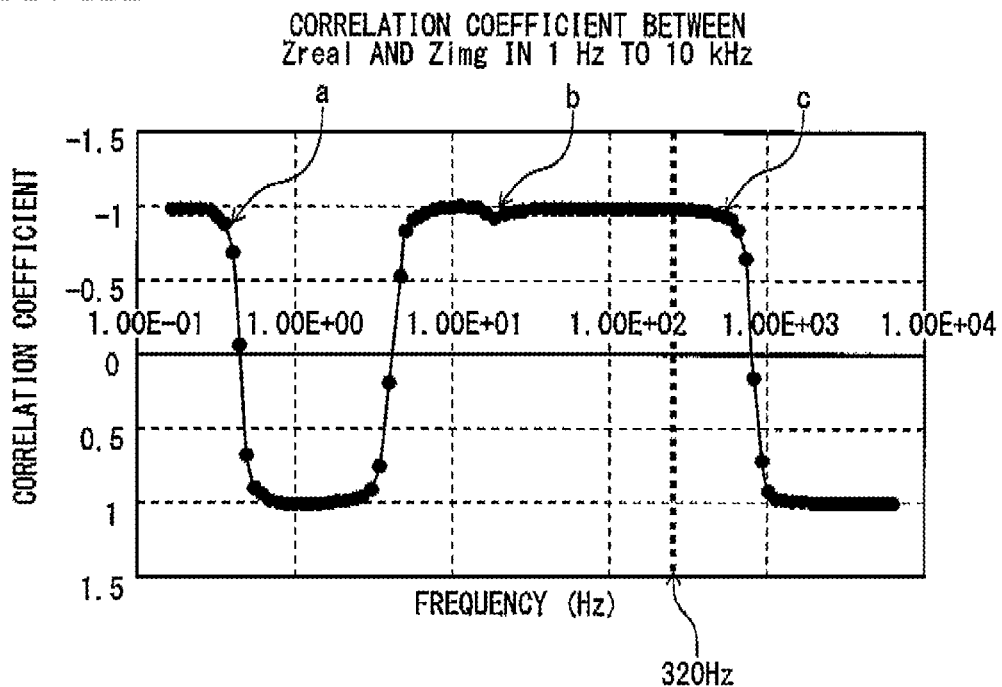
FIG. 9A shows a graph of another correction coefficient and FIG. 9B shows a diagram of another sample impedance characteristic example.
Figure 9B:
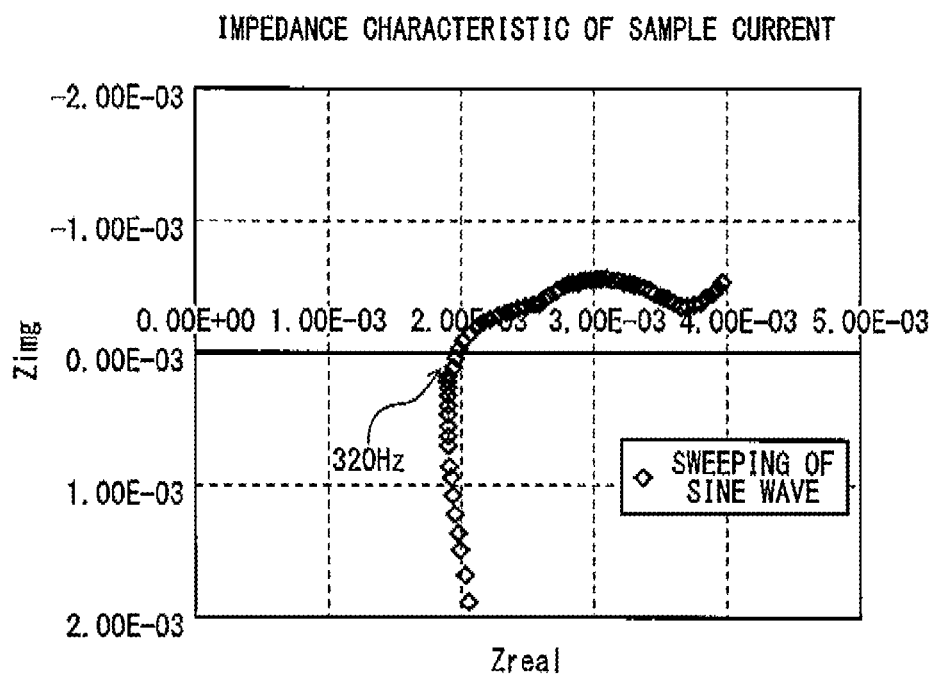

3) Finally, the number of stages of the RC parallel circuit is determined. This determination is performed with the number of times when the correlation coefficient exceeds Corr(i) of −0.95 in a direction from the negative to the positive in whole data. However, a case in which the imaginary axis of the impedance exceeds the Corr(i) of 0.95 in a positive domain is regarded as a LR characteristic and thus the case is not counted. In sample data shown in FIG. 9A, the correlation coefficient exceed −0.95 at three points of a, b, and c, but as shown in FIG. 9B, since the c point exceeds −0.95 at a positive domain in which the impedance imaginary axis exceeds 320 Hz, this case is not counted, and the RC parallel circuit is determined as two stages.

Due to this determination, estimation accuracy of each circuit constant that is estimated and calculated in the circuit constant estimator c4 is improved.

When voltage and current data may be acquired under a sufficient measurement environment, the impedance characteristic may be extracted. However, for example, in a state in which the battery is mounted in the vehicle, due to an effect such as noise, it is difficult to say that a preferable measurement result is always obtained.

In this case, the constant estimation and calculation may be performed in parallel after selecting a plurality of equivalent circuit model candidates, and an equivalent circuit model in which an error with object impedance data is the minimum may be determined as an ultimate output.

In addition, there may be provided a function of calculating an error with object impedance data at any time during repetitive calculation, of stopping the calculation with respect to a model that does not satisfy a reference value or a model that does not clearly converge, and of selecting another model.

In the process that the circuit constants estimator c4 estimates circuit constants, the accuracy of circuit constants estimation can be increased by weighting individual data according to such conditions as a frequency range and measurement accuracy.

Where the impedance characteristic is acquired through a sweeping of pure sine waves, an amplitude can be set for each frequency taking the A/D conversion resolution of the A/D converters into consideration. In contrast, where a waveform such as a pulse which includes plural frequency components is used, the amplitude of each frequency component cannot be controlled. In this case, there may occur an event that at a certain frequency component the A/D conversion resolution is too low to produce a correct impedance value. If circuit constants of an equivalent circuit model are estimated using resulting data, an estimation result may have large errors.

Figure 10B:
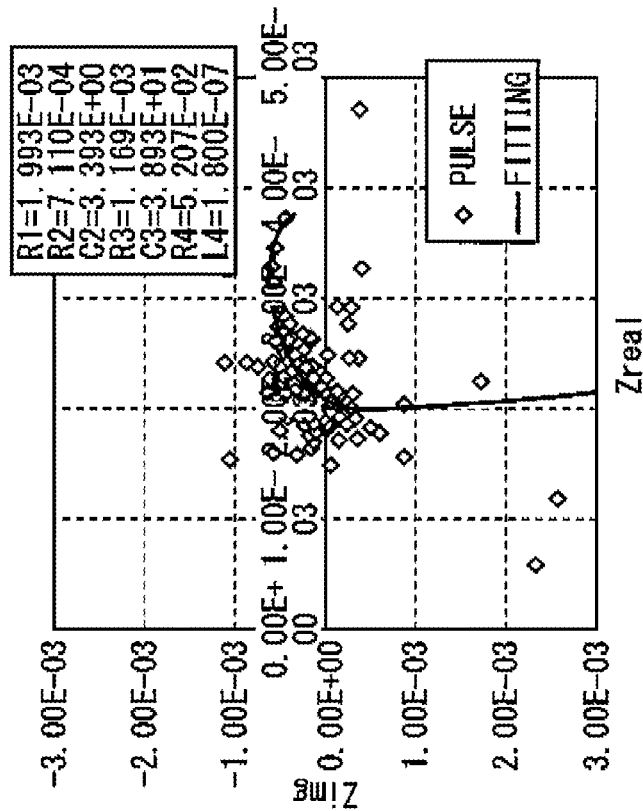
FIGS. 10A and 10B show diagrams of the other sample impedance characteristic example.
Figure 10A:
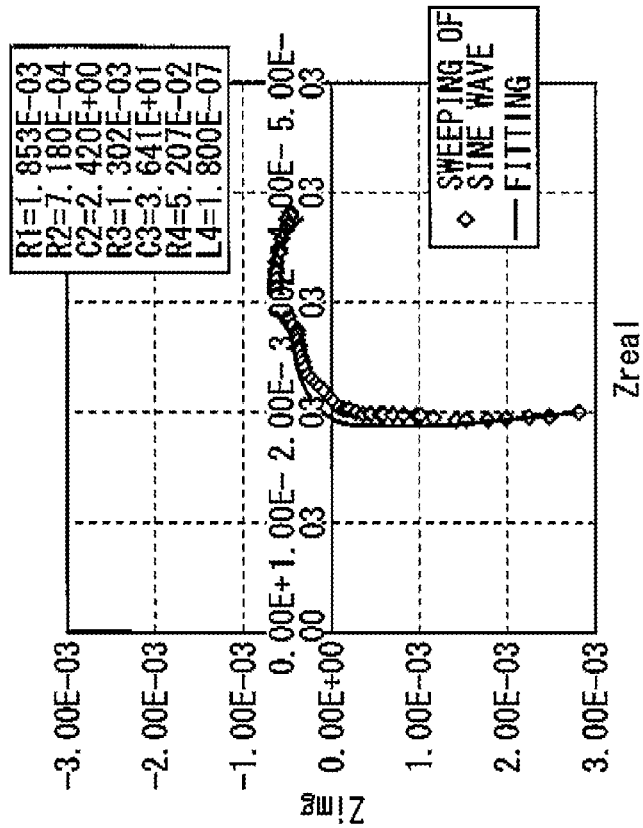
Figure 36:
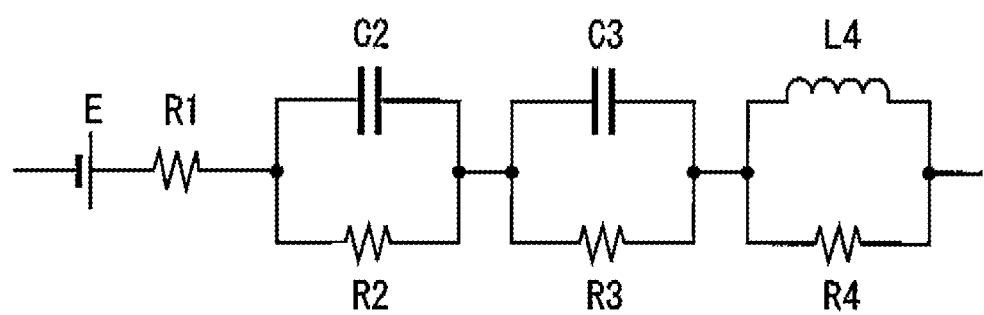
FIG. 36 shows a diagram of an equivalent circuit example of a battery.

Sample data shown in FIG. 10A are the same as the sample data shown in FIG. 4C which correspond to the equivalent circuit of FIG. 36. FIG. 10A shows impedance data obtained from sine wave responses and an impedance characteristic curve obtained through constant fitting. Measurements were performed in such a manner that a sweeping of sine wave was done in a frequency range of 1 Hz to 2.5 kHz and a sufficiently high sampling rate was secured at each measurement frequency. These circuit constants are assumed to be true ones.

FIG. 10B shows results obtained from pulse responses. The constants R4 and L4 are given the values obtained from the sine wave responses. Measurements were performed using a sampling rate of 1 kHz and discrete Fourier transformation was performed in a frequency range of 1 to 450 Hz. Because of the low sampling rate, inductance components that should appear on the high-frequency side were not captured. The measurement results vary to a larger extent as the frequency increases, which would be due to an amplitude distribution of individual frequency components of a pulse and the A/D conversion resolution of the A/D converters.

Figure 11:
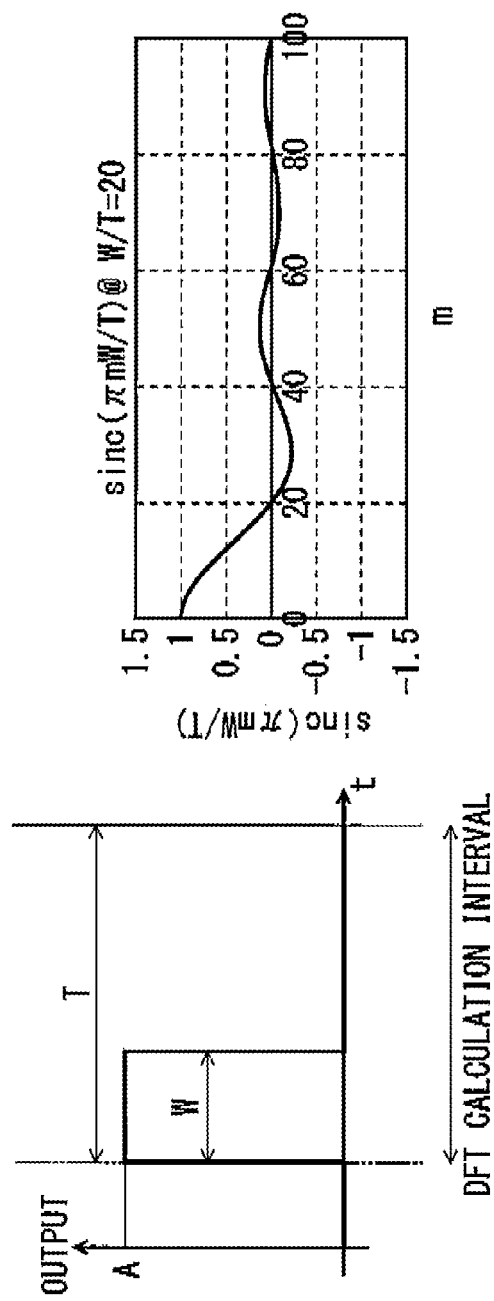
FIG. 11 shows a diagram of a rectangular wave pulse f(t) characteristic example.

Now, consideration will be given to frequency components of a rectangular wave pulse f(t) by developing into a Fourier series. The rectangular wave pulse f(t) is expressed as follows (see FIG. 11):

$$f(t) = \sum_{m=0}^{N} a_m \sin m \frac{2\pi}{T} t$$

$$a_m = \frac{2AW}{T} \text{sinc}\left(\frac{\pi n W}{T}\right)$$

where W is the pulse width, T is the period, and m is an integer that is larger than or equal to 0.

As seen from the above equations, the amplitude $a_m$ becomes very small at certain frequencies and A/D conversion results may have a large variation around those frequencies.

The accuracy of the estimation of equivalent circuit constants may be lowered by such a variation. Certain weighting is considered effective in suppressing the influence of such a variation.

A case of using a Gauss-Newton method for the estimation of circuit constants will be described below as a specific example. The deviations of circuit constants from true values, $\Delta R2$, $\Delta C2$, $\Delta R3$, and $\Delta C3$, are expressed as follows:

$$\begin{bmatrix} \Delta R2 \\ \Delta C2 \\ \Delta R3 \\ \Delta C3 \end{bmatrix} = (J^T J)^{-1} J^T \begin{bmatrix} \Delta z_{j=1} \\ \Delta z_{j=2} \\ \ldots \\ \Delta z_{j=n} \end{bmatrix}$$

where $\Delta z_n$ is the difference between an nth measured impedance and an impedance value calculated at the same frequency on the basis of current circuit constants, J is the Jacobian, and T means matrix transposition. The above calculation is performed repeatedly until the circuit constants converge. Circuit constants are estimated (calculated) according to the following equation by introducing weights p(j):

$$\begin{bmatrix} \Delta R2 \\ \Delta C2 \\ \Delta R3 \\ \Delta C3 \end{bmatrix} = (J^T J)^{-1} J^T \begin{bmatrix} p(1)\Delta z_1 \\ p(2)\Delta z_2 \\ \dots \\ p(n)\Delta z_n \end{bmatrix}$$

Figure 12:
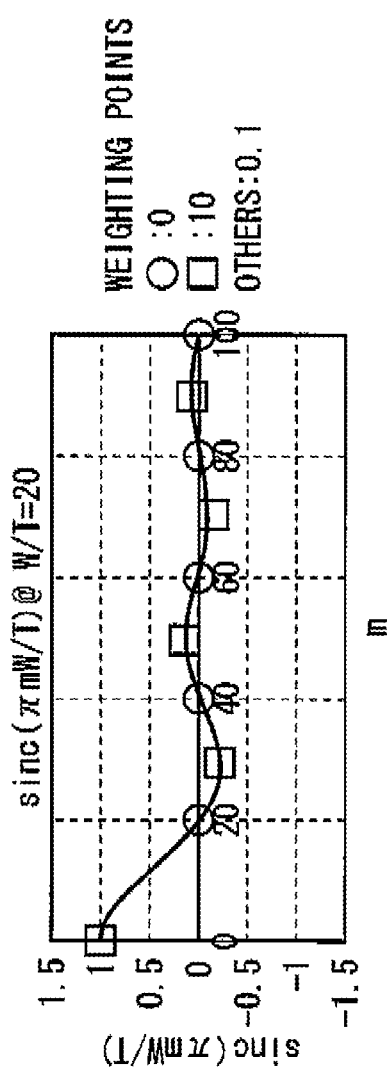
FIG. 12 shows a diagram of a specific example of weighting.

An effect of suppressing the influence of a variation is expected by setting large weights in a frequency range of small amplitudes and small weights in a frequency range of large amplitudes.

Where the response to an input has a shape that is close to a pulse, the following weighting (see FIG. 12), for example, is considered effective because of the properties of a Fourier series:

$$p(j) = \begin{cases} 0 & \text{when } f_j/f_0 = (T/W)k \\ 10 & \text{when } f_j/f_0 = (T/W)(k-1/2) \\ 0.1 & \text{else} \end{cases}$$

where, k is an integer that is larger than or equal to 0, $f_0$ is a frequency corresponding to a DFT calculation interval as a period, $f_j$ is the jth frequency for $f_0$.

Figures 13A, 13B:
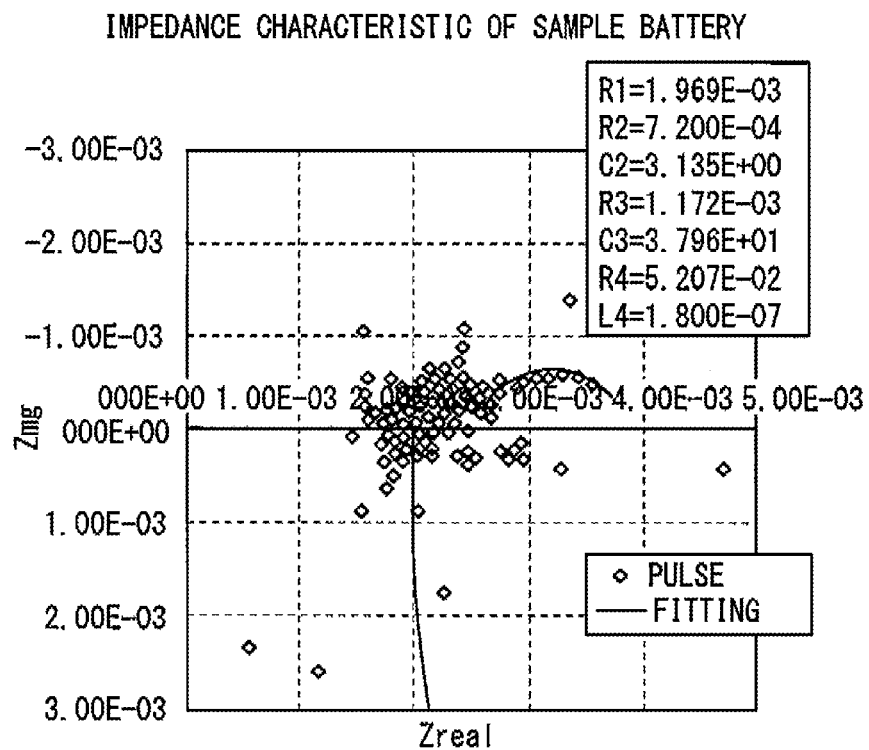
FIGS. 13A and 13B show drawings illustrating example results of constants estimation performed with the weighing.

FIGS. 13A and 13B illustrate example results of circuit constants estimation performed in the above-described manner. FIG. 13A shows an example impedance characteristic, and FIG. 13B shows deviations of sets of estimated circuit constants with and without the weighting from true values. All the circuit constants that were estimated with the weighting are closer to the true values than without the weighting.

FIG. 14 is a block diagram showing another specific example of the equivalent circuit parameter measuring unit 24e. Components having the same or corresponding ones in FIG. 3 or 6 are given the same reference symbols as the latter. A circuit constants estimator c4 shown in FIG. 14 performs a data weighting calculation etc. on the basis of impedance data stored in the impedance data storage unit c3 and a weighting function, a frequency range, etc. that are set through the analysis condition storage unit c8.

With the above measures, as described above, the accuracy of estimation of circuit constants can be increased.

A spike-shaped voltage (current) occurs when a pulse-shaped current (voltage) having a steep rise is applied to a battery having a large inductance component. In such an event, if the sampling rate of the A/D converters is not sufficiently high, whether the spike portion is sampled or not is uncertain, that is, depends on sampling timing (see FIGS. 15A and 15B).

Figure 15A:
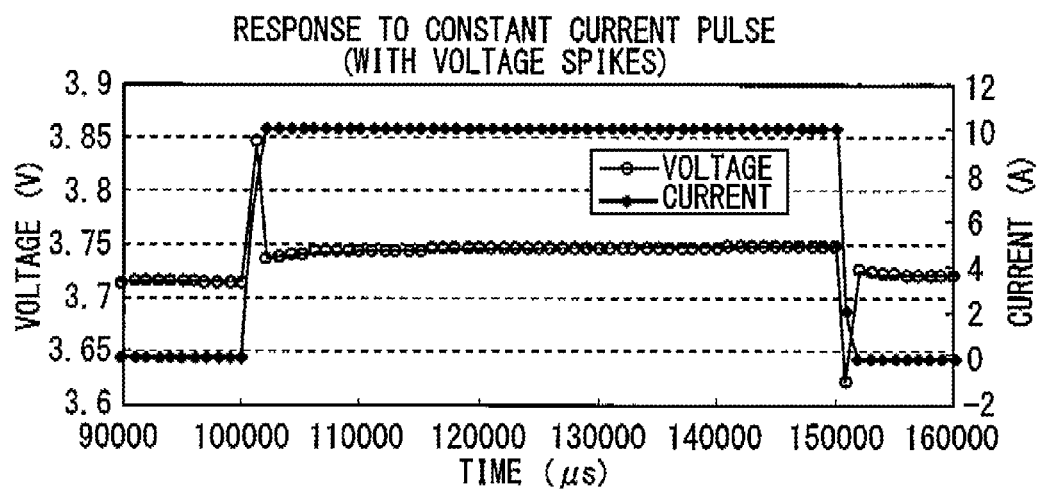
FIGS. 15A and 15B show drawings illustrating the measured response example to a constant current pulse.
Figure 15B:
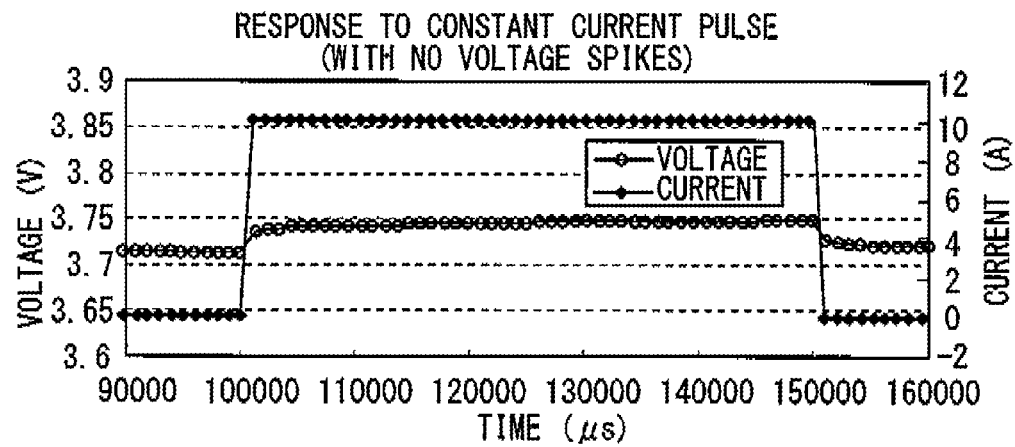

FIGS. 15A and 15B show example measured responses to a constant current pulse. FIG. 15A shows a case that voltage spike portions were sampled, and FIG. 15B shows a case that voltage spike portions were not sampled.

In calculating impedance values of a battery, much different sets of impedance calculation results are obtained when spike portions are sampled and when spike portions are not sampled (the reproducibility is very low).

Figure 16:
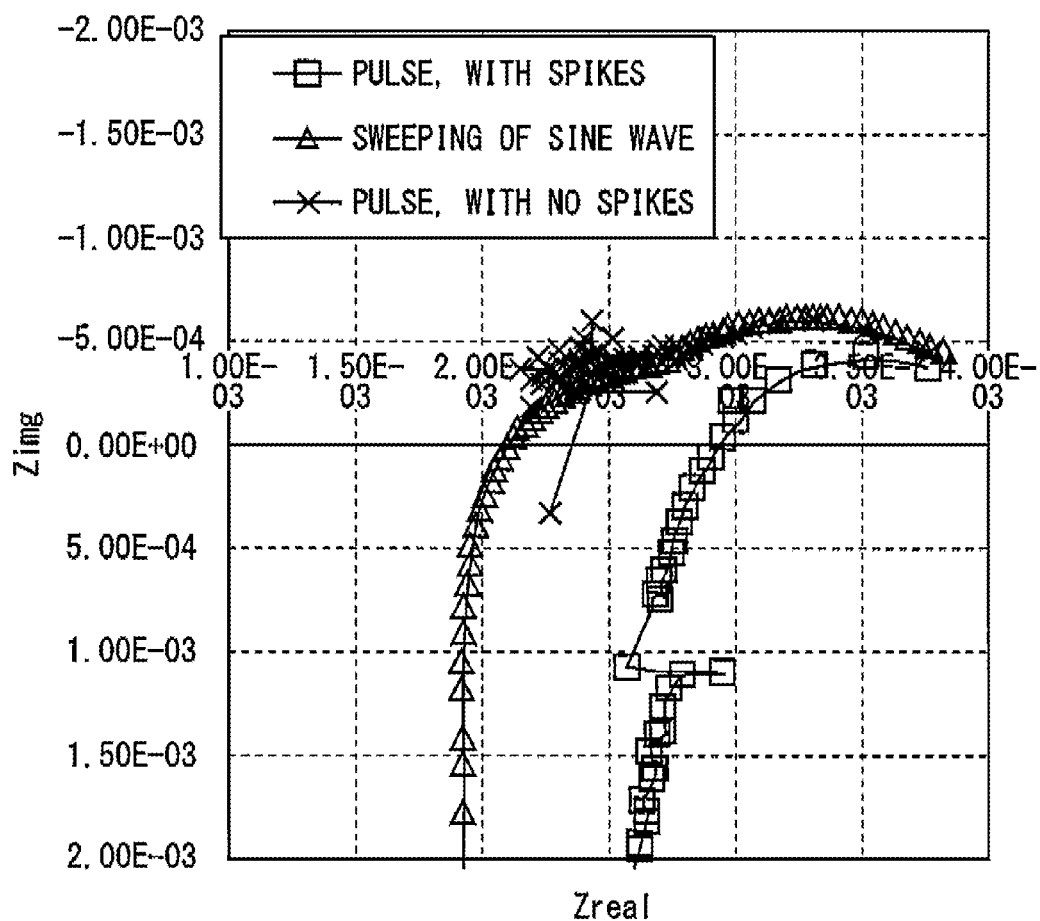
FIG. 16 shows a drawing illustrating the Nyquist plots example.

FIG. 16 shows example Nyquist plots obtained from respective sets of impedance data. The curve "-Δ-" represents a result obtained for sine wave inputs. As mentioned above, a measurement was performed for a sine wave having each frequency with a sufficiently high sampling rate. Since sine waveforms were sufficiently smooth, no spikes occurred in responses unlike in the case of pulse input. In the following, this result represented by the curve "-Δ-" is assumed to have true values.

The curve "-□-" represents a result obtained by performing discrete Fourier transformation on data in which spikes were detected. This result as a whole deviates to a large extent from the true values of the curve "-Δ-" because the sampling rate is not high enough to capture spike portions.

The curve "-x-" represents a result obtained by performing discrete Fourier transformation on data in which no spikes were detected. Since no spike portions were captured, the curve does not extend downward past the imaginary axis and hence lacks an inductance component. It is apparent from the above discussion that much different characteristics appear when spikes are detected and when not.

There is a notion that the inductance of a battery is a structure-dependent parameter and does not vary with age due to such factors as degradations of electrodes and a solution. As mentioned above, spikes are caused by the inductance of a battery. And, in diagnoses as to battery degradation, there is a case in which only R and C components are necessary (i.e., an L component need not be measured). In such a case, resistance R and capacitance C of a battery can be estimated and a diagnosis as to battery degradation can be made if a sufficient amount of, correct information exists on the negative side of the imaginary axis (i.e., in the upper half of the complex plane).

Figure 17:
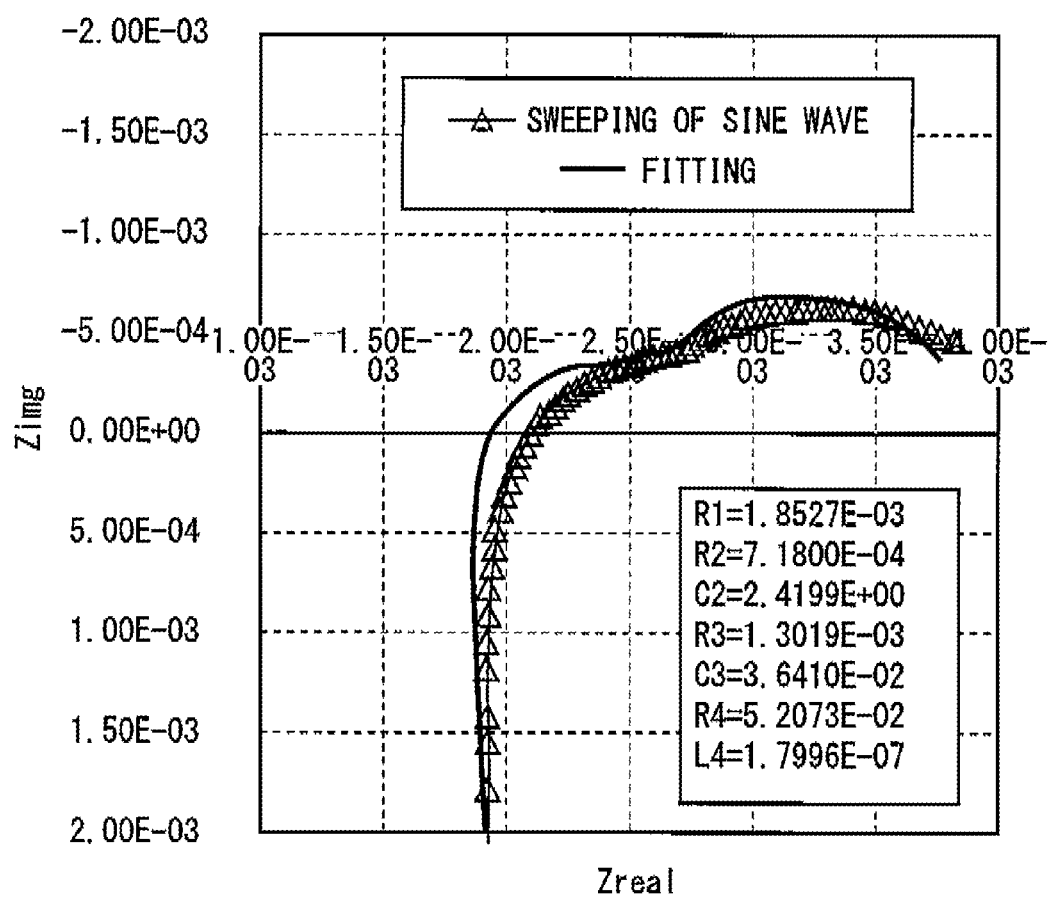
FIG. 17 shows a drawing illustrating the measurement results of respective circuit constants of the equivalent circuit model of FIG. 36 and an impedance characteristic curve for fitting derived from the measurement result.

FIG. 17 shows impedance data obtained in such a manner that a sweeping of sine wave was done in a frequency range of 1 Hz to 2.5 kHz and a sufficiently high sampling rate was secured at each measurement frequency and an impedance characteristic curve derived from constants R1, R2, R3, C2, C3, L4, and R4 that were obtained through constant fitting using the equivalent circuit model of FIG. 36. In the following, these measurement results will be assumed to be true ones.

Figure 18B:
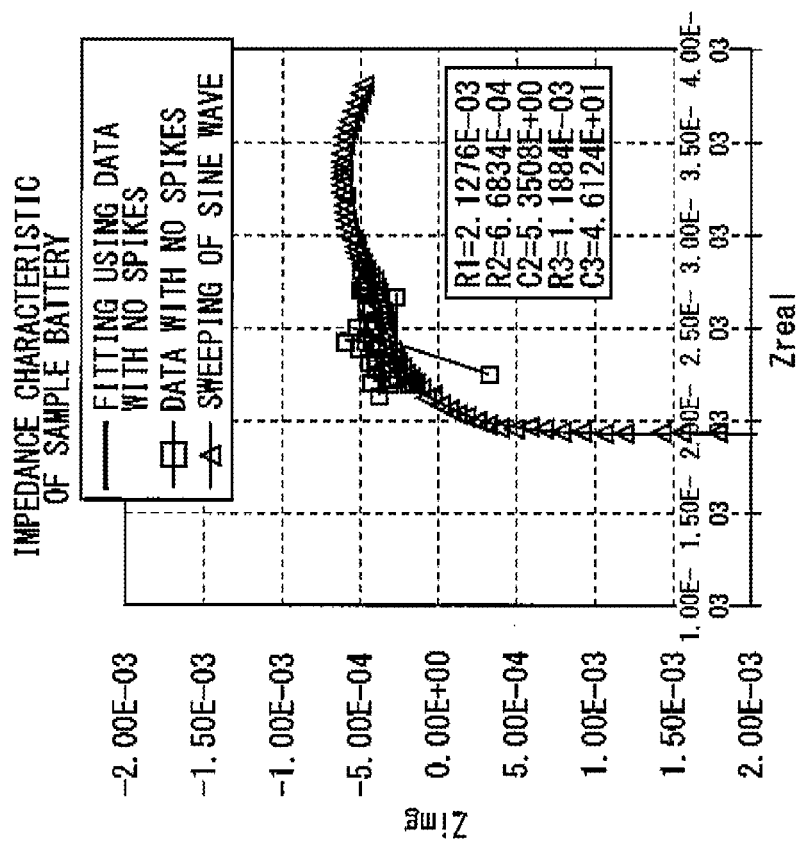
Figure 18A:
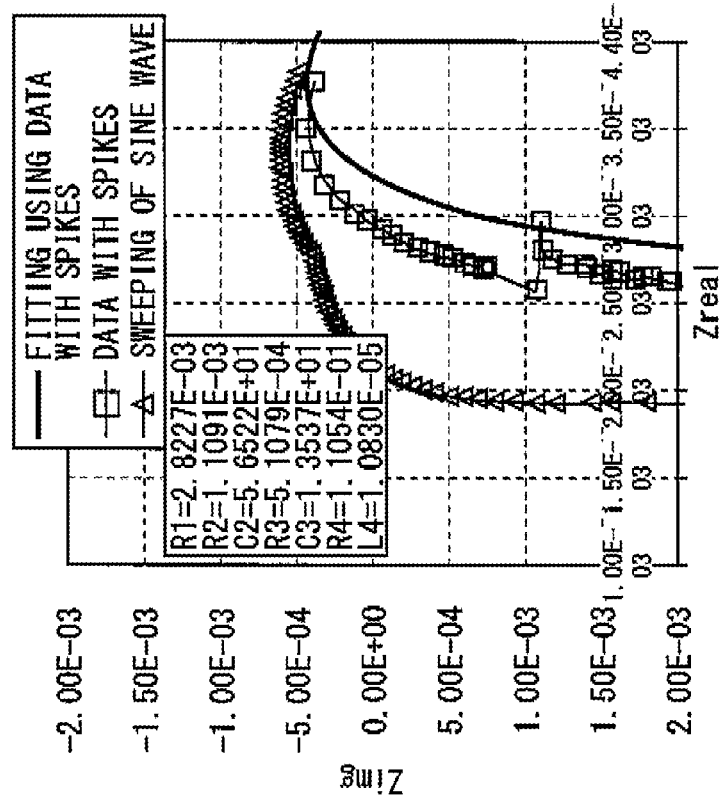

FIGS. 18A and 18B compare impedance characteristics obtained with and without detection of spikes. FIG. 18A shows data of a case that spikes were detected in a pulse response, and FIG. 18B shows data no spikes were detected in a pulse response. For the data of the case that no inductance L component was detected, R4 and L4 were removed from the equivalent circuit model.

FIG. 18C shows deviations of sets of estimated circuit constants with and without detection of spikes from true values. As for the R and C constants, it is seen that results that are close to true values are obtained by performing fitting on the basis of data without detection of spikes. That is, even if the sampling rate is not sufficiently high, a waveform with no spikes allows, at a sufficiently high probability, estimation of R and C constants. However, it is difficult to acquire a waveform with no spikes with high reproducibility.

In view of the above, consideration will be given to how to estimate R and C constants with high reproducibility and accuracy by correcting data having an L component among pulse response data measured at a low sampling rate.

Figure 19:
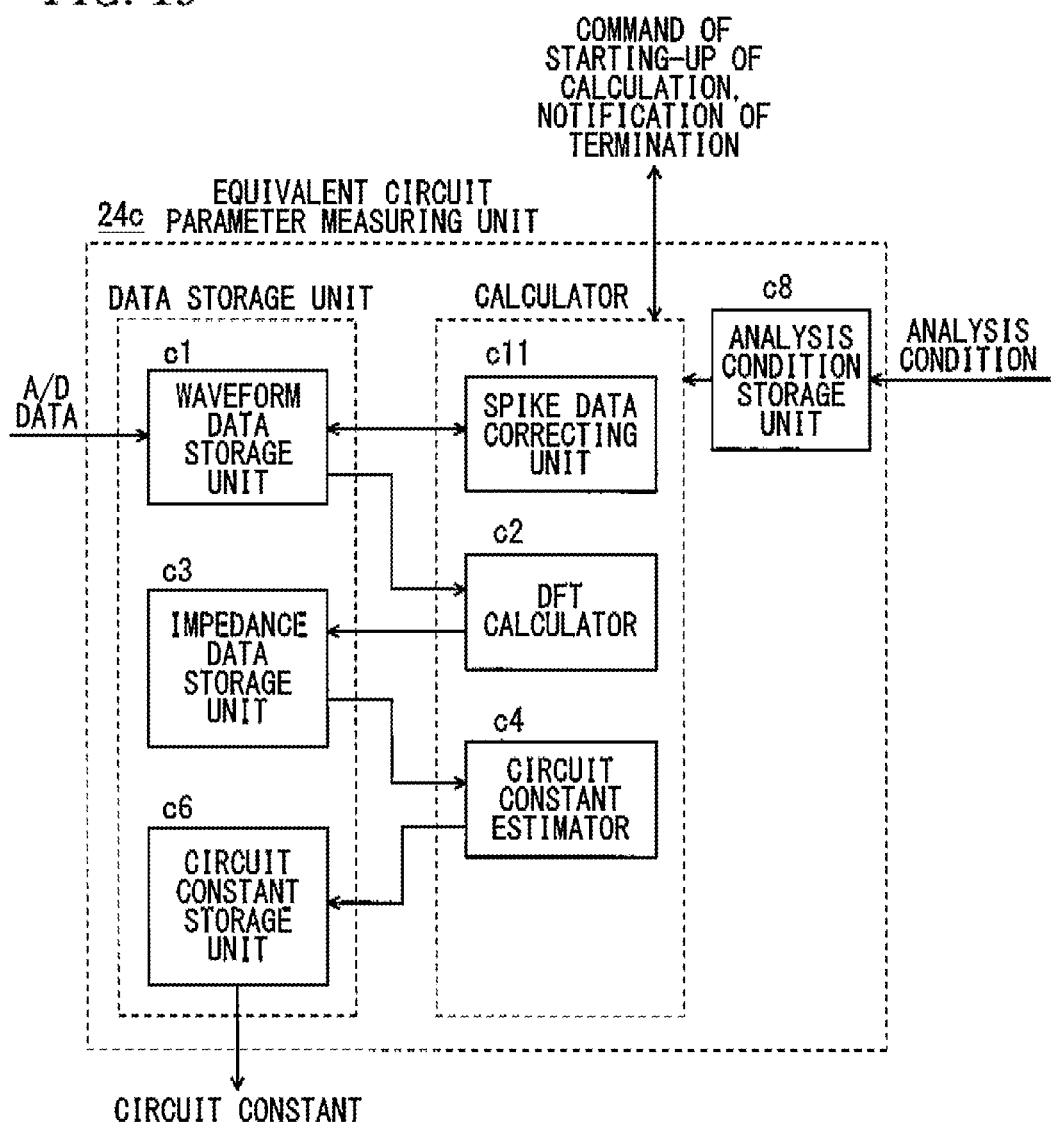
FIG. 19 shows a block diagram illustrating another example of an equivalent circuit parameter measuring unit 24c of FIG. 2.

FIG. 19 is a block diagram showing still another specific example of the equivalent circuit parameter measuring unit 24c. Components having the same or corresponding ones in FIG. 3, 6, or 14 are given the same reference symbols as the latter. A spike data correcting unit e11 shown in FIG. 19 performs a spike correction on waveform data stored in the waveform data storage unit c1. The circuit constants estimator c4 estimates circuit constants through constant fitting on the basis of impedance data stored in the impedance data storage unit c3 and analysis conditions etc. that are set through the analysis condition storage unit c8 and calculates an impedance characteristic curve on the basis of the estimated circuit constants. A calculation result of the circuit constants estimator c4 is stored in the circuit constant storage unit c6.

Figure 20:
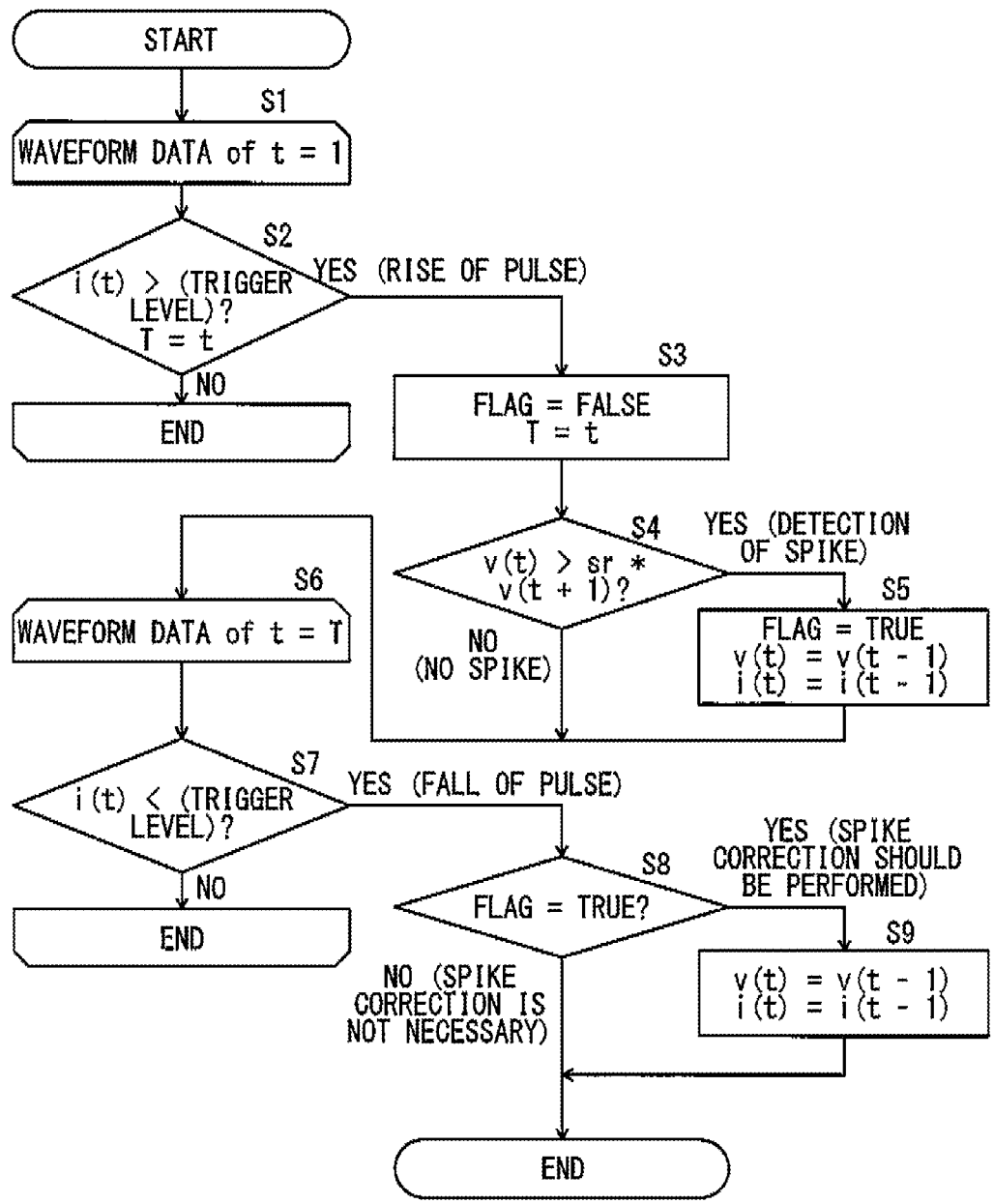
FIG. 20 is a flowchart illustrating a process for correcting inductance L components.

FIG. 20 is a flowchart of a process that the spike data correcting unit c10 corrects inductance L components of waveform data with spikes. In FIG. 20, i(t) represents tth current sampling data, v(t) represents a tth voltage sampling data, and sr denotes a coefficient or detection of a spike. A trigger level serves to detect a rise and a fall of a pulse.

At step S1, waveform data of t=1 is selected. At step S2, to judge whether or not the data belongs to a rise of a pulse, T is set to t and it is judged whether a condition i(t)>(trigger level) is satisfied or not. If this condition is satisfied, it is judged that the data belongs to a rise of the pulse. The process moves to step S3, where T is set to t and a flag is set to "false,"

At step S4, to judge whether a spike has been detected or not, it is judged whether a condition v(t)>sr×v(t+1) is satisfied or not. If this condition is satisfied, it is judged that a spike has been detected and the process moves to step S5, where the fiat is set to "true" and v(t) and i(t) are made equal to v(t−1) and i(t−1), respectively. At step S6, waveform data of t=T is selected. If the condition is not satisfied at step S4, it is judged that no spike has been detected and the process moves to step S6 directly.

At step S7, to judge whether or not the data belongs to a fall of the pulse, it is judged whether a condition i(t)<(trigger level) is satisfied or not. If this condition is satisfied, it is judged that the data belongs to a fall of the pulse. At step S8, to judge whether a spike correction should be performed, it is judged whether the flag is "true" or not. If this condition is satisfied, it is judged that a spike correction should be performed and the process moves to step S9, where v(t) and i(t) are made equal to v(t−1) and i(t−1), respectively. Then, the process is finished. If the condition is not satisfied at step S8, it is judged that no spike correction should be performed and the process is finished.

Figures 21A, 21B:
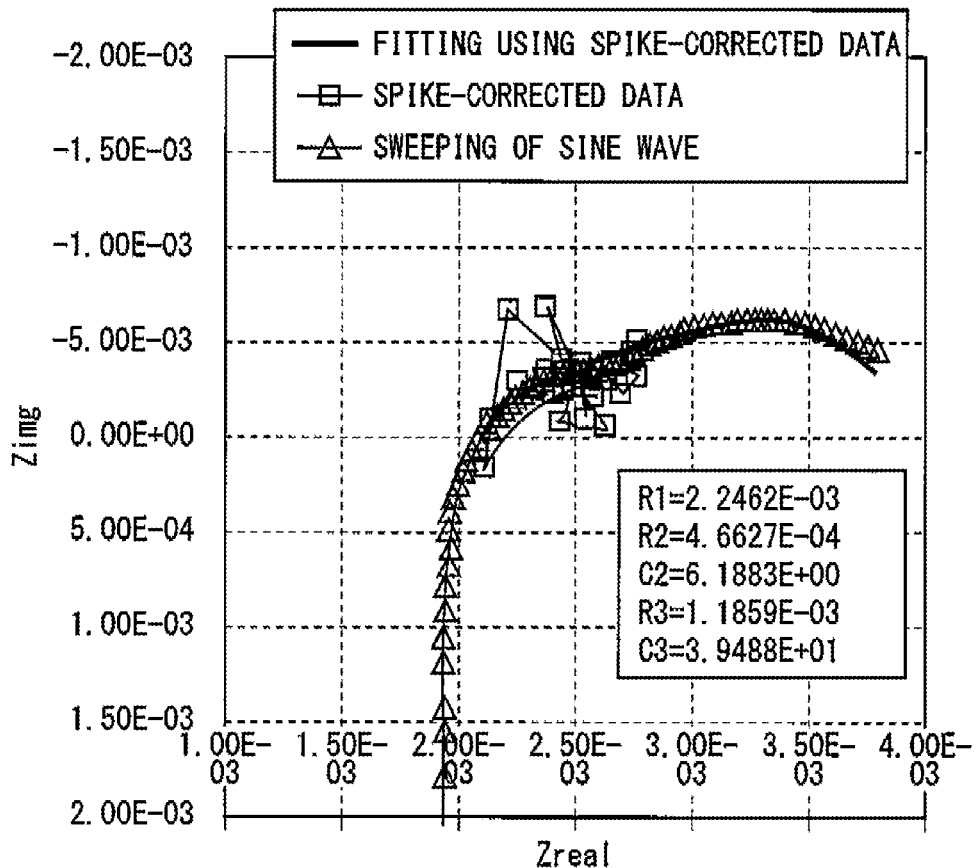
FIGS. 21A and 21B show drawings illustrating the result example of equivalent circuit fitting that was performed using waveform data with spikes as corrected according to the process of FIG. 20.

FIGS. 21A and 21B illustrate example results of equivalent circuit fitting that was performed using waveform data with spikes as corrected according to the process of FIG. 20. FIG. 21A shows an impedance characteristic curve, and FIG. 21B shows deviations of the circuit constants from true values before and after the correction. All the corrected circuit constants are closer to the true values than the uncorrected ones.

Figure 22:
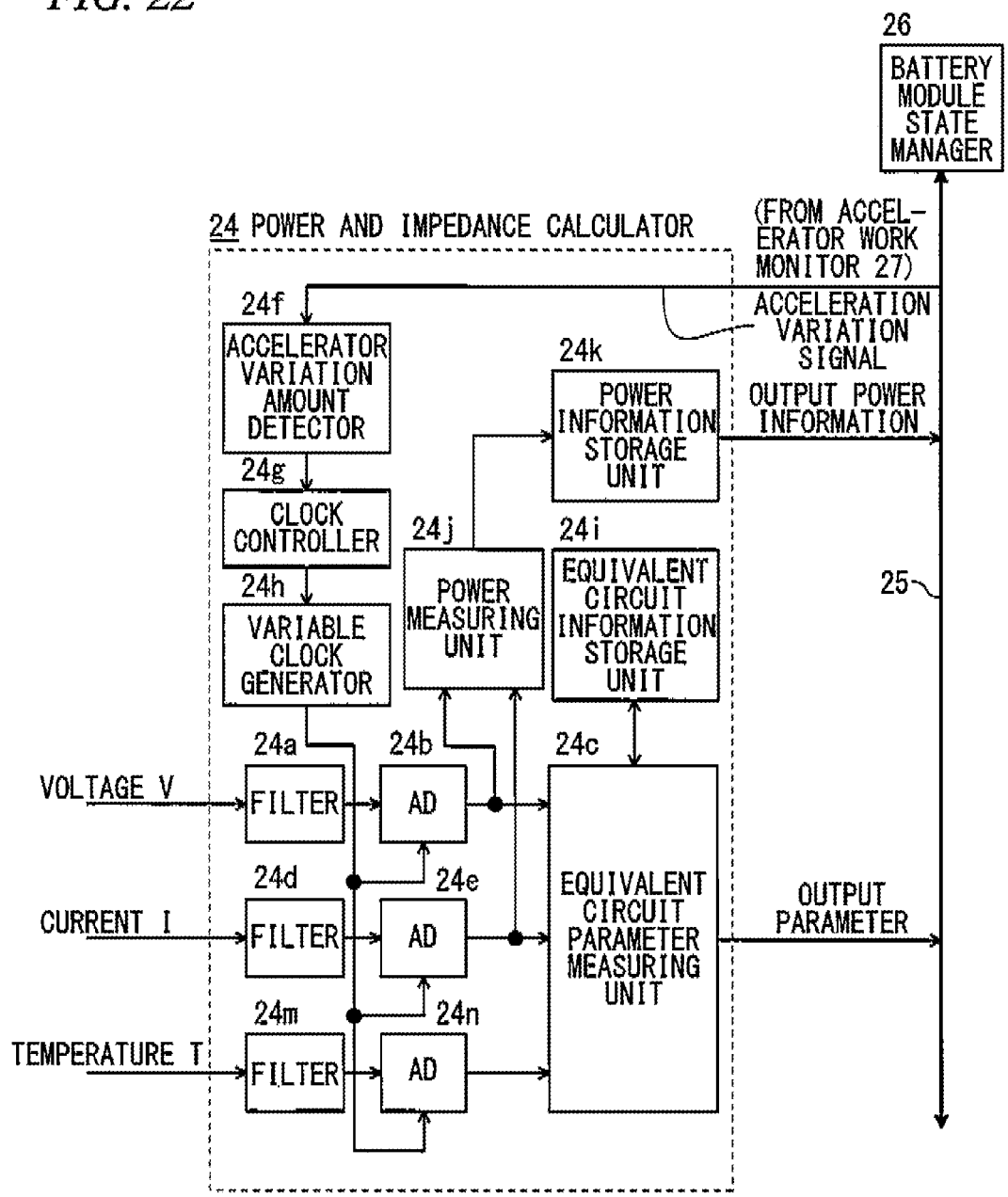
FIG. 22 shows a block diagram illustrating another example of a power and impedance calculator 24.

FIG. 22 is a block diagram showing another specific example of each power and impedance calculator 24. As shown in FIG. 22, the power and impedance calculator 24 takes in not only a voltage signal V and a current signal I but also a temperature signal T from the associated one of the battery cells $11_1$-$11_n$.

The temperature signal T which is output from a temperature sensor (not shown) is input to an A/D converter 24n via an anti-aliasing filter 24m, and output data of the A/D converter 24n is input to an equivalent circuit parameter measuring unit 24c.

The impedance characteristic of a battery varies to a large extent depending on the temperature environment. Therefore, to produce a degradation-battery capacity-impedance table, it is indispensable to employ a temperature parameter, Therefore, as shown in FIG. 22, it is effective to have a temperature monitoring result of the associated one of the battery cells $11_1$-$11_n$ reflected in the power and impedance calculator 24.

The embodiment of FIG. 1 is directed to a case that the actual load is the vehicular driving system in which the accelerator L1, the inverter L2, and the motor L3 are substantially connected to each other and an impedance characteristic is estimated on the basis of how an output voltage waveform of each of the battery cells $11_1$-$11_n$ and an output current of the current sensor 12 vary as they rise or fall stepwise. Where the actual load does not produce high-frequency components, impedance estimation to a high-frequency range is enabled by connecting a pseudo-load device DL to the actual load in parallel and causing it to generate a waveform containing high-frequency components.

Example output waveforms of the pseudo-load device DL are a rectangular wave and a triangular wave. It is appropriate that the pseudo-load device DL be configured so as to produce various amplitude values taking a battery discharge rate, for example, into consideration.

In addition, the power and impedance calculator 24 that is used in the invention may be packaged in an ultra-compact size by using a semiconductor integrated circuit technology, and even in the case of being mounted in each battery cell of a battery module that is mounted, for example, in a vehicle, the power and impedance calculator 24 may be used as long as a minuscule space is secured.

Figure 24:
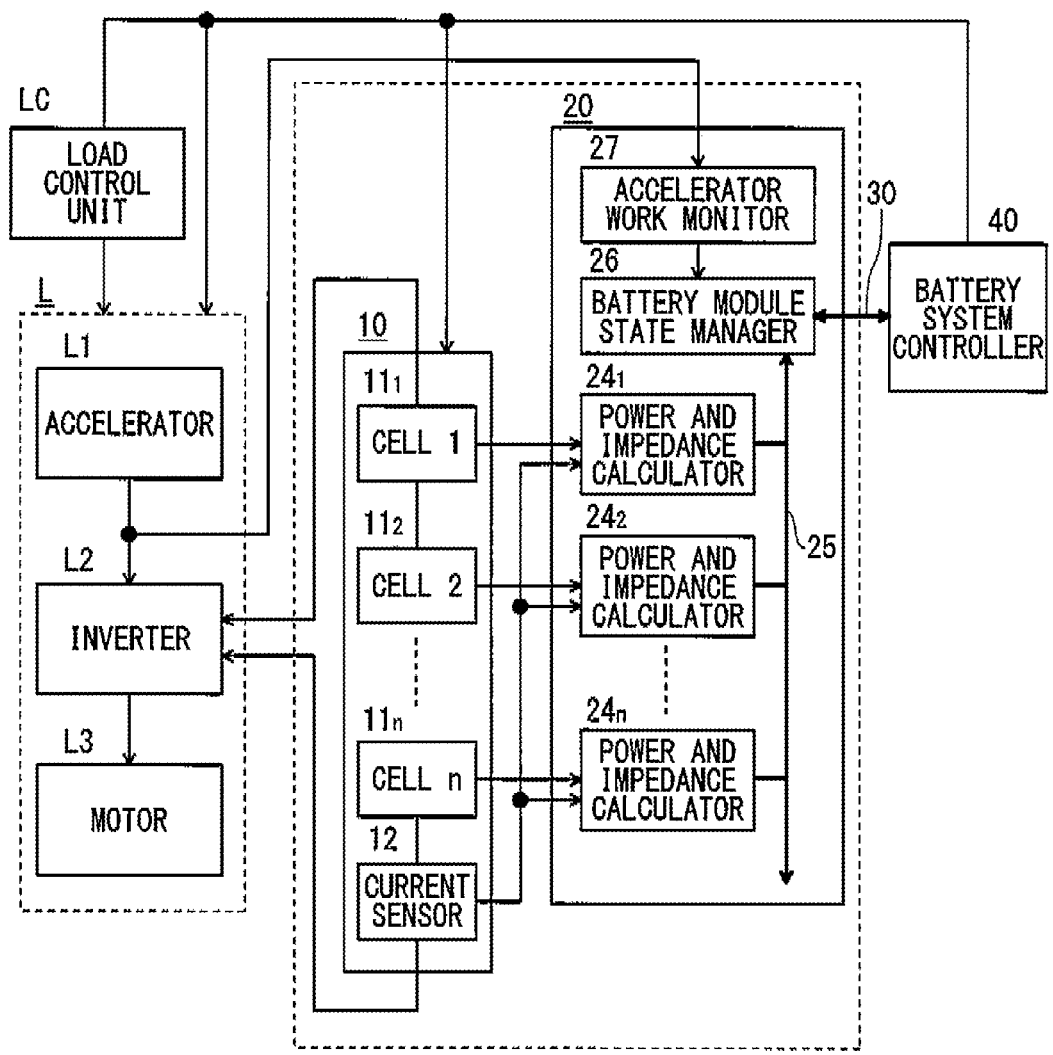
FIG. 24 shows a block diagram illustrating the other embodiment of the invention.

FIG. 24 is a block diagram of a battery system according to another embodiment of the invention. Components having the same or corresponding ones in FIG. 1 are given the same reference symbols as the latter. Referring to FIG. 24, a load control unit LC drives and controls a load device L such as a vehicle driving system according to a preset, prescribed load program.

This makes it possible to reproduce a running state that cannot be realized in an actual run and to thereby measure, with the power and impedance calculators $24_1$-$24_n$, how a resulting load variation influence the battery module 10.

Figure 25:
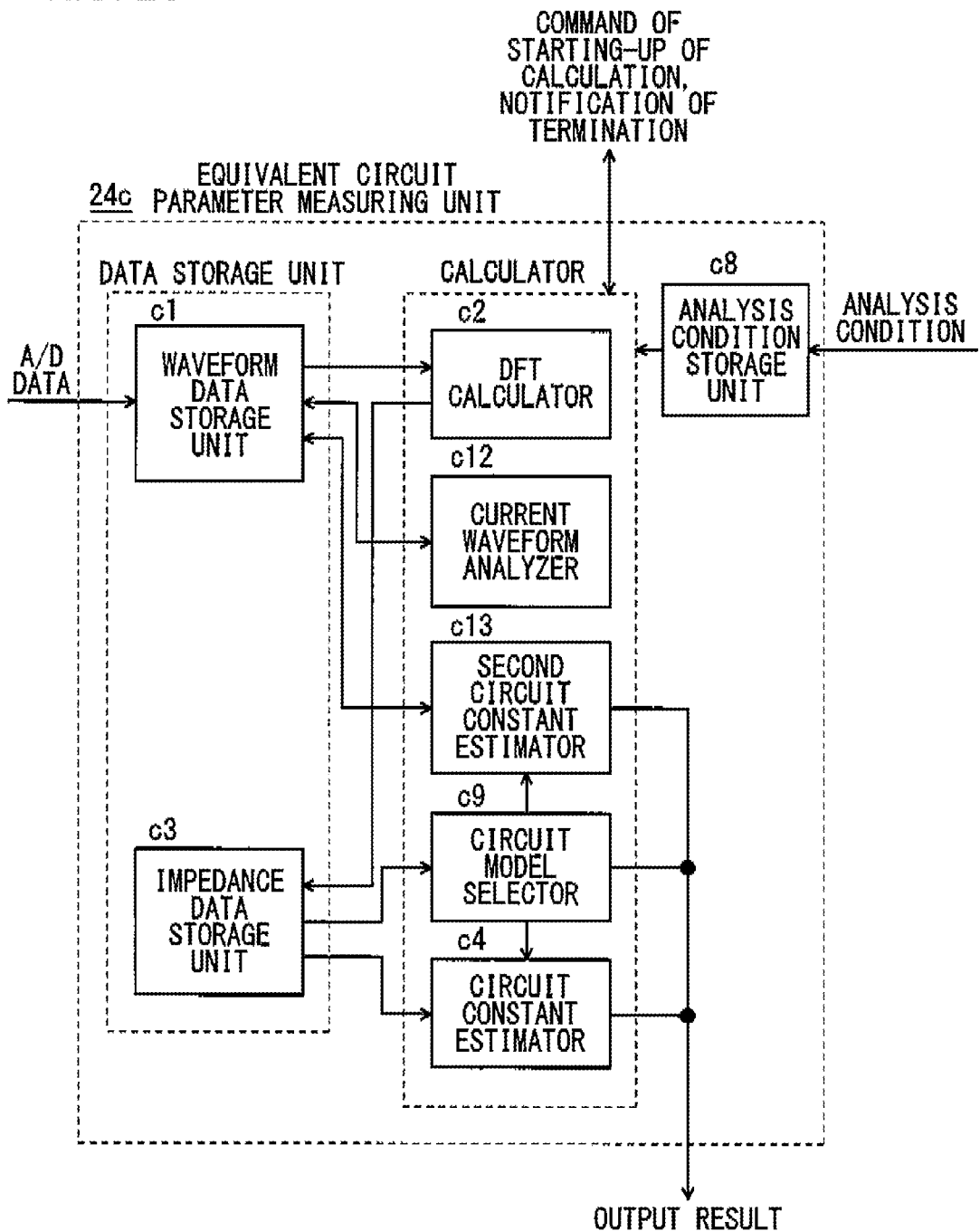
FIG. 25 shows a block diagram illustrating another example of an equivalent circuit parameter measuring unit 24c of FIG. 2.

FIG. 25 is a block diagram showing a further specific example of the equivalent circuit parameter measuring unit 24c shown in FIG. 2. Components having the same or corresponding ones in FIG. 6 are given the same reference symbols as the latter. In the equivalent circuit parameter measuring unit 24c of FIG. 25, a current waveform analyzer c12 and a second circuit constants estimator c13 are added to the calculator.

A description will be made of a process for measuring an impedance characteristic (shown in FIG. 26) of a battery using a device which incorporates the equivalent circuit parameter measuring unit 24c of FIG. 25. It is assumed that an equivalent circuit shown in FIG. 27 is used.

Figure 26:
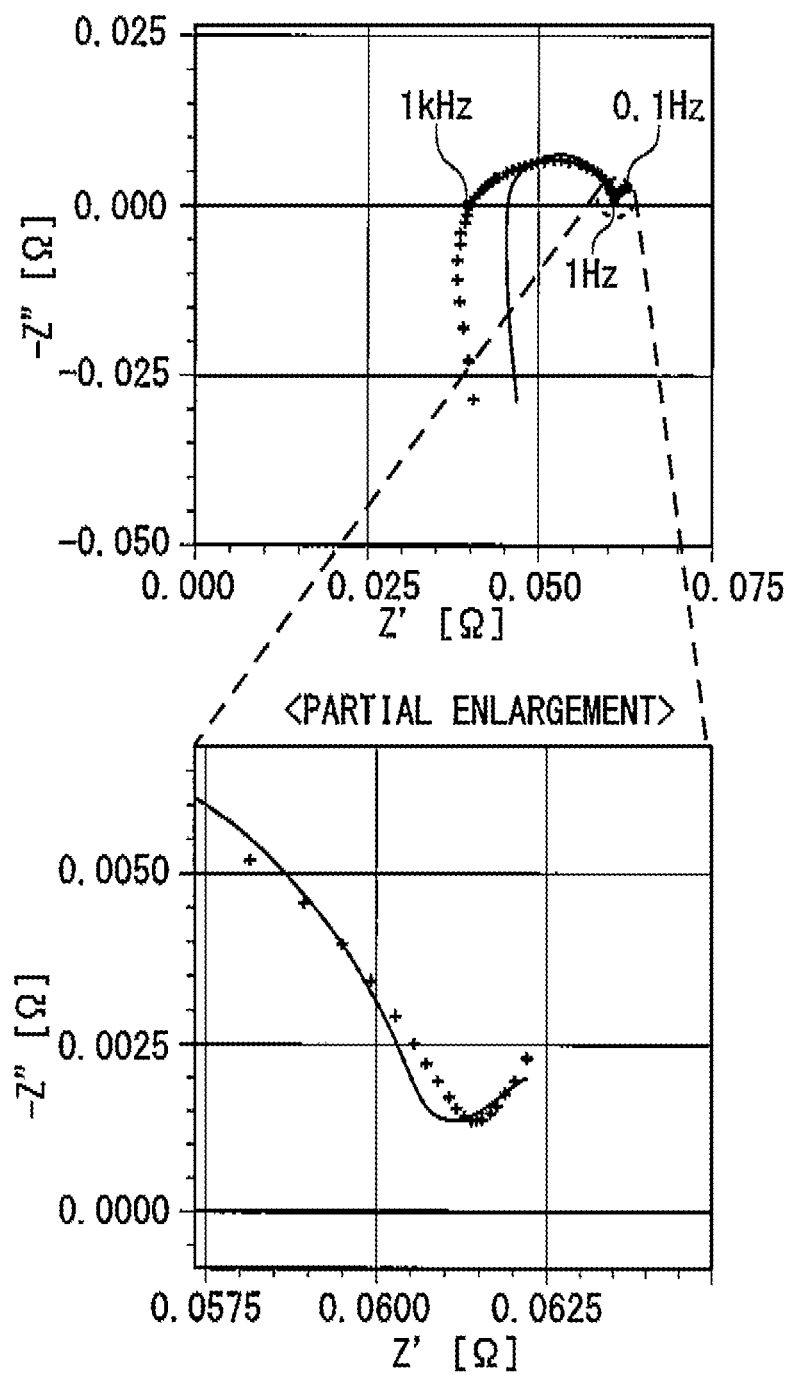
FIG. 26 shows a diagram of an impedance characteristic example of a battery.
Figure 27:
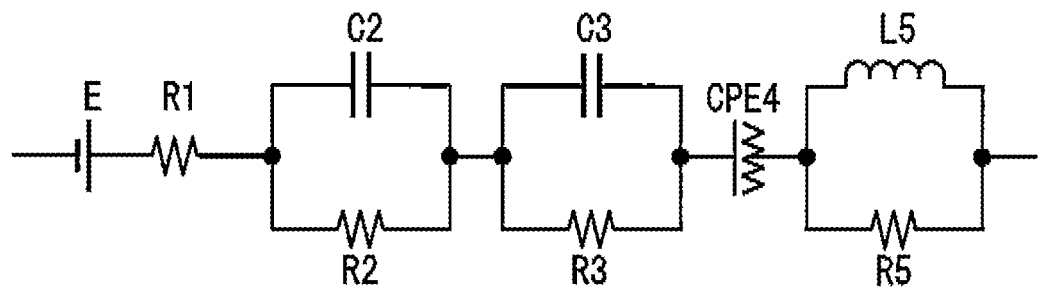
FIG. 27 shows a diagram of an equivalent circuit example of the battery in FIG. 26.

It is seen from FIG. 26 that the impedance characteristic of the battery have features in respective frequency regions. The impedance characteristic is dominated by inductance in a frequency range that is higher than or equal to 1 kHz, dominated by conductance in a frequency range of 1 Hz to 1 kHz, and is dominated by a CPE (constant phase element) (i.e., approximately proportional to $f^p$) in a frequency range that is lower than or equal to 1 Hz. The CPE is given by the following equation:

$$CPE = \frac{1}{T(j\omega)^p}$$

The process will be described with reference to FIGS. 24 and 25.

1) A proper current load is given to the battery module 10 from the load device L such as a vehicle driving system.

2) The accelerator work monitor 27 monitors the load generation state on the basis of an acceleration variation signal, and outputs a measurement start instruction to each power and impedance calculator 24 with proper timing via the battery module state manager 26.

3) Upon completion of a measurement, in each power and impedance calculator 24, the current waveform analyzer c12 analyzes the shapes of current waveform data and only data that satisfies conditions (e.g., the discharge pulse width is 500±10 ms and 10 seconds or more have elapsed since the termination of a discharge) that are set in the analysis condition storage unit c8 is stored in the waveform data storage unit c1.

Steps 1) to 3) are repeated until waveform data that satisfies the preset, prescribed conditions is acquired. Although in the configuration of FIG. 2 a sampling rate as a condition is set on the basis of the acceleration variation signal, it may be set in the analysis condition storage unit c8.

4) After the acquisition of the data, the second circuit constants estimator c13 reads the waveform data that satisfies the prescribed conditions from the waveform data storage unit c1, and performs the following circuit constants estimation calculation. It is assumed that an equivalent circuit model to be used has already been selected by the circuit model selector c9.

Figure 28:
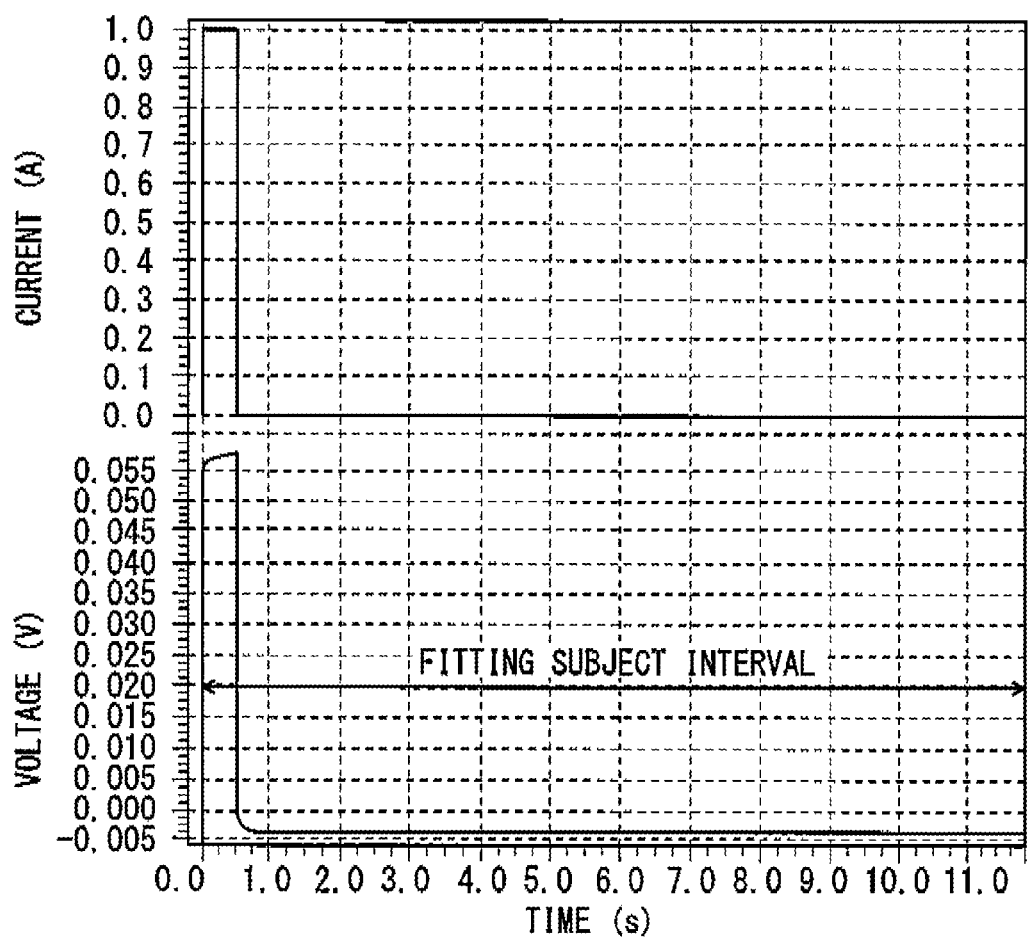
FIG. 28 shows a diagram of a long fitting subject interval.

4-1) First, as shown in FIG. 28, R1, R2, C2, R3, C3, and a CPE (p and T) are estimated in such a manner that the overall interval of the waveform data that satisfies the prescribed conditions is employed as a fitting subject interval. In this embodiment, since a measurement pulse has a width 500 ms, the duty ratio of the fitting subject waveform is shorter smaller than or equal to 0.05. This is to obtain a feature in a frequency range that is lower than or equal to 1 Hz, that is, p and T of a CPE.

Figure 29:
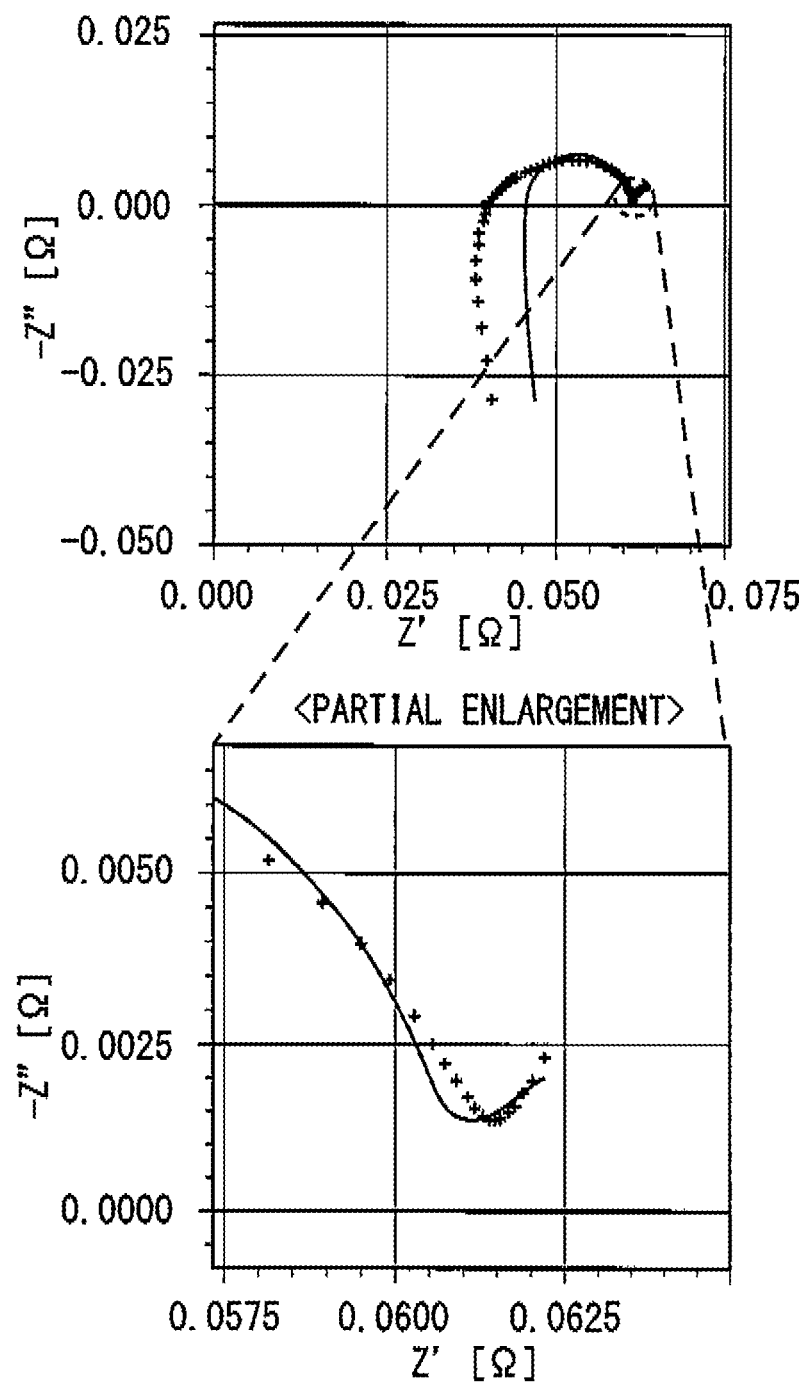
FIG. 29 shows a drawing of an impedance characteristic example derived from circuit constants that were estimated.

The solid line shown in FIG. 29 represents an impedance characteristic derived from circuit constants that were estimated in the above-described manner. The characteristic plotted with mark "+" is a characteristic obtained through a measurement with, application of an AC-voltage-superimposed waveform. With an assumption that the latter characteristic is a true one, it is seen that the estimation accuracy was high in a low-frequency range but low in a high-frequency range.

The above estimation result is explained as follows. In the estimation of FIG. 29, the fitting was performed using a time waveform that lasts more than 10 seconds which is far longer than a very short time during which a variation of a feature having a short time constant appears remarkably. Therefore, a feature approximately in the frequency range of 0.1 Hz to 1 Hz for which many time-domain samples were produced was mainly subjected to fitting, as a result of which relatively large errors occurred on the high-frequency range where a variation in a very short time is important.

Figure 30:
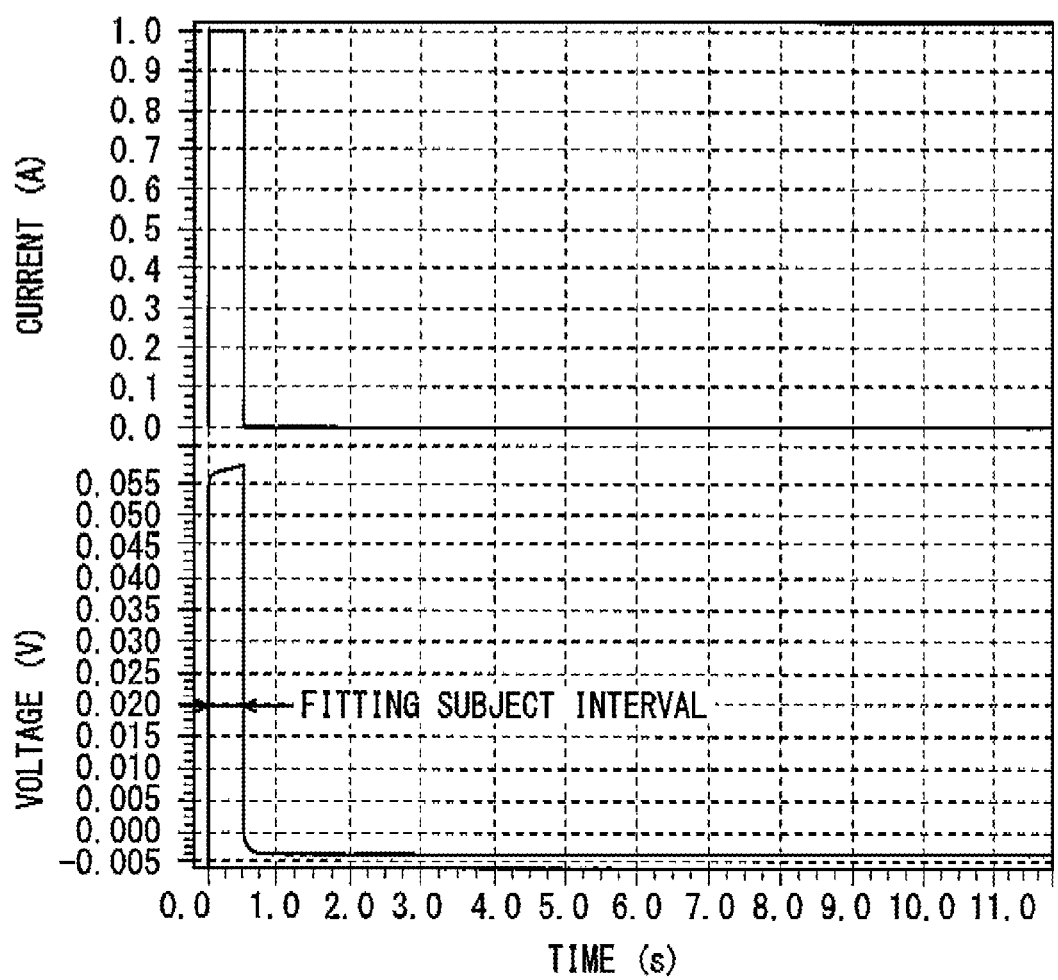
FIG. 30 shows a diagram of a short fitting subject interval.

4-2) Then, the portion, in the interval of 0 to 1 second, of the waveform data that satisfies the prescribed conditions is extracted as a fitting subject portion (see FIG. 30). And R1, R2, C2, R3, and C3 are estimated again in such a manner that the CPE (p and T) determined at substep 4-1) are made fixed constants. At this time, the duty ratio of the fitting subject waveform is about 0.5. This is to obtain features in the frequency range that is higher than or equal to 1 Hz, that is, R and C constants.

It is assumed that R5 and L5 are fixed values because they are independent of the reaction system of the battery and are determined by the structure of the battery.

Initial values of the respective circuit constants may be set arbitrarily. However, when the speed of convergence on a solution and practical operation of a degradation diagnosis are taken into consideration, it is desirable to employ constant values of a characteristic before degradation.

Figure 31:
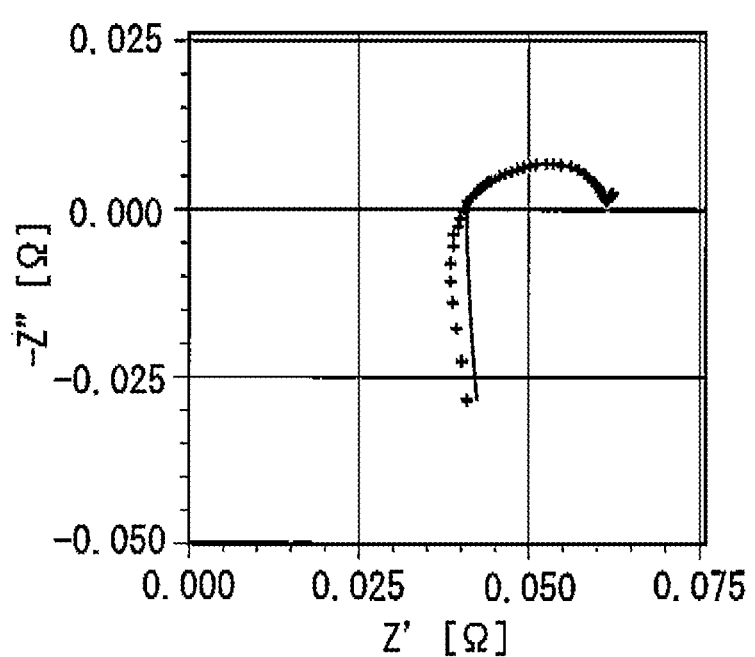
FIG. 31 shows a drawing of an impedance characteristic example derived from circuit constants that were re-estimated.

FIG. 31 shows an impedance characteristic derived on the basis of re-estimated circuit constants. The deviation of the characteristic drawn by the solid line from the characteristic plotted with mark "+" is much reduced from that of FIG. 29. This is explained as follows. In the estimation of FIG. 29, the fitting was performed using a time waveform that lasts more than 10 seconds which is far longer than a very short time during which a variation of a feature having a short time constant appears remarkably. Therefore, a feature approximately in the frequency range of 0.1 Hz to 1 Hz for which many time-domain samples were produced was mainly subjected to fitting, as a result of which relatively large errors occurred on the high-frequency range where a variation in a very short time is important.

5) The circuit constants obtained at step 4) are transferred to the battery module state manager 26. The battery module state manager 26 judges a degradation state of the battery on the basis of the circuit constants, and informs the battery system controller 40 of a judgment result.

As described above, measurement data are acquired at such a time resolution and in such a time span that optimum estimation of a time constant of reaction occurring in a battery is enabled according to the reaction time constant. And constants of equivalent circuit elements that are considered to govern the time constant are estimated using those measurement data. This is done for each time constant. In this manner, the accuracy of estimation of equivalent circuit constants can be increased.

Common optimal solution search algorithms such as a gradient method, a heuristic method, and a direct method can be used for the fitting of equivalent circuit constants.

Figure 23:
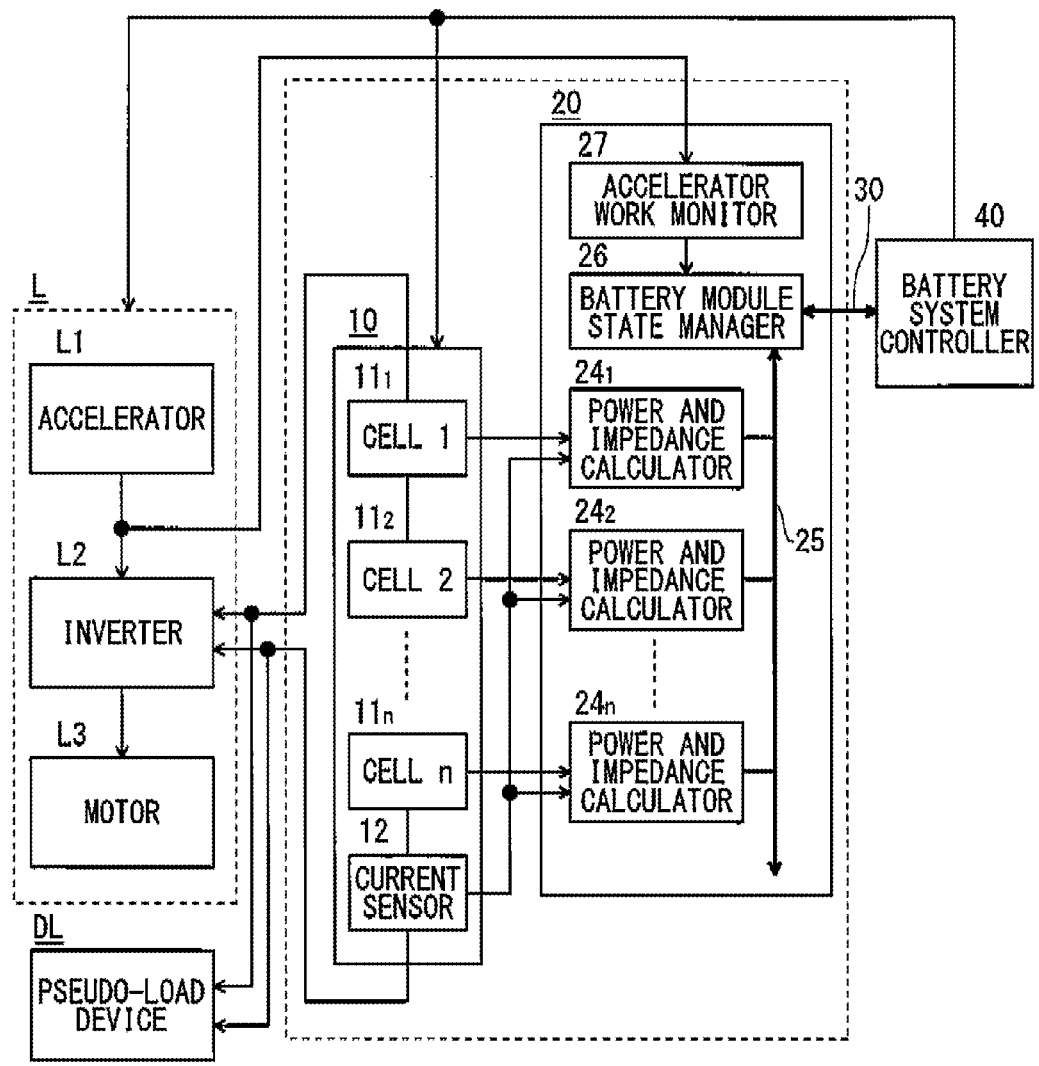
FIG. 23 shows a block diagram illustrating another embodiment of the invention.

The load control unit LC which is provided in FIG. 24 is effectively used also in the battery system of FIG. 23 which uses the pseudo-load device DL, because it makes it possible to drive and control the load device L (vehicle driving system) according to a preset, prescribed load program.

Figure 37:
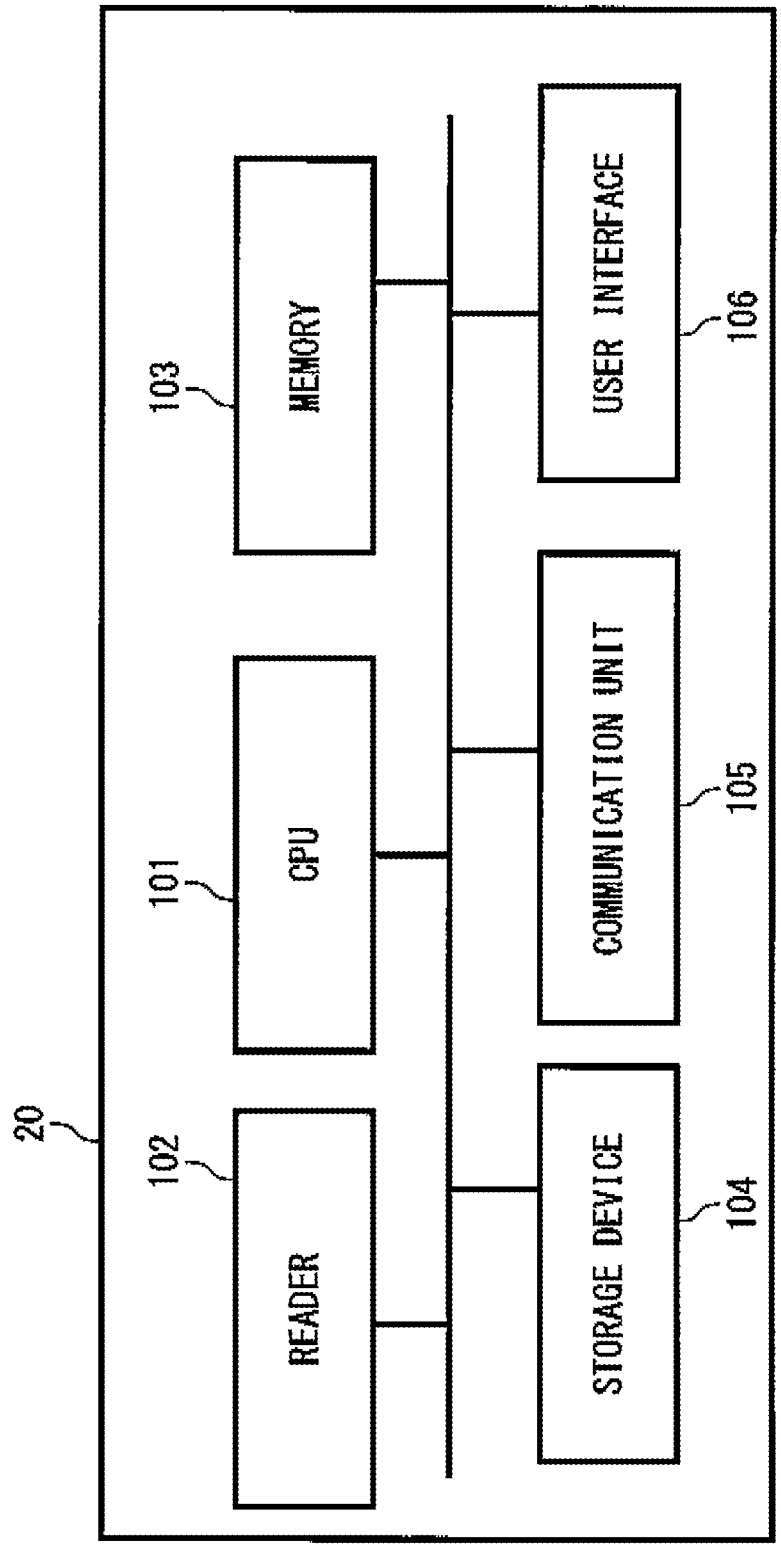
FIG. 37 is a schematic diagram showing a hardware configuration of the battery monitoring device according to the embodiment.

FIG. 37 is a schematic diagram showing a hardware configuration of the battery monitoring device 20 according to the present embodiment. As shown in FIG. 37, the battery monitoring device 20 includes a CPU 101, a reader 102, a memory 103, a storage device 104, a communication unit 105 and a user interface 106. The CPU 101 (for example, a processor) may serve as the power and impedance calculators $24_1$ to $24_n$, the battery module state manager 26 and the accelerator work monitor 27 shown in FIG. 1.

The memory 103 may be any type of memory such as ROM, RAM or a flash memory. The memory 103 may serve as a working memory of the CPU 101 when the CPU 101 executes a program. The storage device 104 is configured to store programs to be executed by the CPU 101 and/or data generated by the respective units. The storage device 104 may be any type of storage device such as a hard disk drive (HDD) or solid state drive (SSD). A program which includes instructions for causing the CPU 101 to execute respective operations performed by the battery monitoring device 20 may be stored in the storage device 104 or in a computer-readable medium such as a Blue-ray Disc (trademark), DVD, a CD, a floppy disc, a flash memory, or magneto-optical (MO) disc. The reader 102 is configured to read the program stored in the above-computer readable medium into the memory 103. The program may be also downloaded from another device (for example, a server) on a network (for example, the Internet) through the communication unit 105. With this configuration shown in FIG. 37, the CPU 101 is configured to implement the respective operations performed by the battery monitoring device 20 according to the program read from the reader 102 or downloaded through the communication unit 105.

In addition, in the respective embodiments, a description was made with respect to an example in which the internal impedance of each of the battery cells of the battery module that is mounted in the vehicle is measured, but the battery impedance measuring device of the invention is also effective for the monitoring of a storage battery that is provided in a power plant, a household power storage system, and the like other than the vehicle.

As described above, according to the invention, a battery monitoring device, which measures an internal impedance characteristic of a battery in real time in the on-site such as a vehicle, a power plant, a household power storage system, and the like that actually use the battery and which monitors a battery state in real time, may be realized.

What is claimed is:

1. A battery monitoring device for real-time measurement and monitoring of a battery module driving an actual load and having a plurality of battery cells connected together in series, comprising:
  a plurality of power and impedance calculators each provided for one of the plurality of battery cells, and configured to receive voltage signals and current signals from the plurality of battery cells, respectively and to measure instantaneous power values and internal impedance characteristics of the plurality of battery cells, respectively;
  a battery module state manager configured to receive output data of the plurality of power and impedance calculators via an internal bus,
  a load state monitor configured to monitor a state of load of the battery module, and to input a detection signal to the plurality of power and impedance calculators and the battery module state manager; and
  an accelerator work monitor configured to monitor movement of the accelerator which is part of a vehicle driving system as a load device of the battery module, and to supply the resulting detection signal to the plurality of power and impedance calculators and the battery module state manager,
  wherein, based on a detection signal of variation of at least one of an accelerator, current, voltage, or a power waveform, a condition occurs, the condition comprising extraction of at least one of the current, voltage, or power waveform, and setting at least one of a sampling clock frequency, correction of measurement data, or a frequency analysis,
  wherein each of the plurality of power and impedance calculators is configured to acquire measurement data at such a time resolution and based on a time span that optimum estimation of a time constant of reaction occurring in a battery cell is enabled according to the reaction time constant, and to estimate constants of an equivalent circuit that are considered to govern the time constant using the acquired measurement data.

2. The battery monitoring device according to claim 1, wherein each of the plurality of power and impedance calculators is configured to perform discrete Fourier transformation or fast Fourier transformation, and to estimate constants of an equivalent circuit that exhibits an internal impedance characteristic of the associated battery cell in a desired frequency domain on the basis of results of the discrete Fourier transformation or fast Fourier transformation.

3. The battery monitoring device according to claim 1, wherein the power and impedance calculators are configured to receive pieces of temperature information of the plurality of battery cells, respectively.

4. The battery monitoring device according to claim 1, further comprising: a pseudo-load device connected to the actual load in parallel and configured to generate a waveform including high-frequency components.

5. The battery monitoring device according to claim 1, further comprising: a load control unit configured to drive and control the actual load according to a load program.

6. The battery monitoring device according to claim 1, wherein one of the plurality of power and impedance calculators comprises an accelerator variation amount detector, a clock controller, and a variable clock generator.

7. The battery monitoring device according to claim 1, wherein one of the plurality of power and impedance calculators comprises a power measuring unit and a power information storage unit.

8. The battery monitoring device according to claim 1, wherein the data from the battery monitoring device comprises trend data of instantaneous power of each of the battery cells.

* * * * *